(12) United States Patent
Walker

(10) Patent No.: US 9,658,277 B2
(45) Date of Patent: May 23, 2017

(54) TESTING AND SETTING PERFORMANCE PARAMETERS IN A SEMICONDUCTOR DEVICE AND METHOD THEREFOR

(71) Applicant: Darryl G. Walker, San Jose, CA (US)

(72) Inventor: Darryl G. Walker, San Jose, CA (US)

( * ) Notice: Subject to any disclaimer, the term of this patent is extended or adjusted under 35 U.S.C. 154(b) by 470 days.

(21) Appl. No.: 14/484,620

(22) Filed: Sep. 12, 2014

(65) Prior Publication Data

US 2016/0054380 A1    Feb. 25, 2016

Related U.S. Application Data

(60) Provisional application No. 62/039,494, filed on Aug. 20, 2014.

(51) Int. Cl.

| G06M 3/02 | (2006.01) |
|---|---|
| G01R 31/26 | (2014.01) |
| G01R 31/02 | (2006.01) |
| G11C 7/04 | (2006.01) |
| G11C 29/02 | (2006.01) |
| G11C 29/50 | (2006.01) |
| G01R 31/28 | (2006.01) |
| G11C 29/00 | (2006.01) |
| G11C 11/406 | (2006.01) |

(52) U.S. Cl.
CPC ....... G01R 31/2628 (2013.01); G01R 31/025 (2013.01); G01R 31/2875 (2013.01); G11C 7/04 (2013.01); G11C 11/40626 (2013.01); G11C 29/023 (2013.01); G11C 29/028 (2013.01); G11C 29/50 (2013.01); G11C 29/50016 (2013.01); G01R 31/2856 (2013.01); *G11C 11/40615* (2013.01); *G11C 29/006* (2013.01); *G11C 2029/5002* (2013.01)

(58) Field of Classification Search
USPC ...................................................... 377/2, 44
See application file for complete search history.

(56) References Cited

U.S. PATENT DOCUMENTS

| 3,450,867 A | 6/1969 | Blum et al. |
|---|---|---|
| 3,459,925 A | 8/1969 | Goosey et al. |
| 3,573,776 A | 4/1971 | Dick et al. |
| 3,903,395 A | 9/1975 | Hamstra |
| 4,493,981 A | 1/1985 | Payne |
| 4,502,043 A | 2/1985 | Moore |

(Continued)

FOREIGN PATENT DOCUMENTS

| WO | WO-95/25296 | 9/1995 |
|---|---|---|
| WO | WO-03/077091 | 9/2003 |

OTHER PUBLICATIONS

U.S. Appl. No. 62/039,494, filed Aug. 20, 2014, Walker.

(Continued)

*Primary Examiner* — Adam Houston

(57) ABSTRACT

A method of determining temperature ranges and setting performance parameters in a semiconductor device that may include at least one temperature sensing circuit is disclosed. The temperature sensing circuits may be used to control various operating parameters to improve the operation of the semiconductor device over a wide temperature range. The performance parameters may be set to improve speed parameters and/or decrease current consumption over a wide range of temperature ranges.

20 Claims, 18 Drawing Sheets

(56) References Cited

U.S. PATENT DOCUMENTS

| | | | |
|---|---|---|---|
| 4,564,748 A | 1/1986 | Gupton | |
| 4,833,406 A | 5/1989 | Foster | |
| 5,111,691 A | 5/1992 | John et al. | |
| 5,278,796 A | 1/1994 | Tillinghast et al. | |
| 5,287,292 A | 2/1994 | Kenny et al. | |
| 5,303,160 A | 4/1994 | Winter et al. | |
| 5,394,172 A * | 2/1995 | McLaury | G11C 7/1075 345/554 |
| 5,469,195 A * | 11/1995 | Yung | H01L 27/0805 257/E27.048 |
| 5,638,418 A | 6/1997 | Douglass et al. | |
| 5,699,317 A * | 12/1997 | Sartore | G06F 12/0893 365/230.05 |
| 5,717,323 A | 2/1998 | Tailliet | |
| 5,724,030 A | 3/1998 | Urbas et al. | |
| 5,742,177 A | 4/1998 | Kalb, Jr. | |
| 5,774,425 A | 6/1998 | Ivanov et al. | |
| 5,798,663 A | 8/1998 | Fugere et al. | |
| 5,841,204 A | 11/1998 | English | |
| 5,873,053 A | 2/1999 | Pricer et al. | |
| 5,875,142 A | 2/1999 | Chevallier | |
| 5,875,312 A | 2/1999 | Walsh et al. | |
| 5,931,011 A | 8/1999 | Shima et al. | |
| 5,956,289 A | 9/1999 | Norman et al. | |
| 6,002,627 A | 12/1999 | Chevallier | |
| 6,091,255 A | 7/2000 | Godfrey | |
| 6,134,167 A | 10/2000 | Atkinson | |
| 6,140,860 A | 10/2000 | Sandhu et al. | |
| 6,150,872 A | 11/2000 | McNeill et al. | |
| 6,160,755 A | 12/2000 | Norman et al. | |
| 6,363,490 B1 | 3/2002 | Senyk | |
| 6,438,057 B1 | 8/2002 | Ruckerbauer | |
| 6,442,500 B1 | 8/2002 | Kim | |
| 6,507,530 B1 | 1/2003 | Williams et al. | |
| 6,512,614 B1 * | 1/2003 | Saleh | H04Q 11/0062 370/389 |
| 6,549,065 B2 | 4/2003 | Opris | |
| 6,567,763 B1 | 5/2003 | Javanifard et al. | |
| 6,674,623 B1 | 1/2004 | Abe et al. | |
| 6,678,185 B1 | 1/2004 | Cleary | |
| 6,717,530 B1 | 4/2004 | Schmidt et al. | |
| 6,847,911 B2 | 1/2005 | Huckaby et al. | |
| 6,937,087 B2 | 8/2005 | Sim et al. | |
| 6,974,252 B2 | 12/2005 | Bowden et al. | |
| 6,975,047 B2 | 12/2005 | Pippin | |
| 6,980,918 B2 | 12/2005 | Gunther et al. | |
| 6,985,000 B2 | 1/2006 | Feder et al. | |
| 7,035,157 B2 | 4/2006 | Chang | |
| 7,038,967 B2 | 5/2006 | Uchikoba et al. | |
| 7,078,955 B2 | 7/2006 | Kim et al. | |
| 7,102,417 B2 | 9/2006 | Gordon et al. | |
| 7,106,127 B2 | 9/2006 | Sim et al. | |
| 7,107,178 B2 | 9/2006 | Won et al. | |
| 7,158,911 B2 | 1/2007 | Gunther et al. | |
| 7,173,844 B2 | 2/2007 | Lee et al. | |
| 7,177,218 B2 | 2/2007 | Choi et al. | |
| 7,184,313 B2 | 2/2007 | Betser et al. | |
| 7,193,917 B2 | 3/2007 | Takahashi et al. | |
| 7,216,064 B1 | 5/2007 | Pippin | |
| 7,248,527 B2 | 7/2007 | Park | |
| 7,292,488 B2 | 11/2007 | Hokenmaier et al. | |
| 7,310,013 B2 | 12/2007 | Porter | |
| 7,315,792 B2 | 1/2008 | Min et al. | |
| 7,376,532 B2 | 5/2008 | Johns et al. | |
| 7,383,149 B1 | 6/2008 | Walker | |
| 7,423,473 B2 | 9/2008 | Kim | |
| 7,460,394 B2 | 12/2008 | Happ et al. | |
| 7,480,588 B1 | 1/2009 | Walker | |
| 7,483,270 B2 | 1/2009 | Blake | |
| 7,483,806 B1 | 1/2009 | Arsovski et al. | |
| 7,492,657 B2 | 2/2009 | Sako | |
| 7,532,056 B2 | 5/2009 | Seo | |
| 7,535,786 B1 | 5/2009 | Walker | |
| 7,553,077 B2 | 6/2009 | Schubring et al. | |
| 7,554,869 B2 | 6/2009 | Kim et al. | |
| 7,581,881 B2 | 9/2009 | Kim et al. | |
| 7,583,553 B2 | 9/2009 | Mori | |
| 7,592,820 B2 | 9/2009 | Laakso et al. | |
| 7,603,249 B1 | 10/2009 | Walker | |
| 7,630,266 B2 | 12/2009 | Incarnati et al. | |
| 7,654,736 B2 | 2/2010 | Walker | |
| 7,695,188 B2 | 4/2010 | Sri-Jayantha et al. | |
| 7,760,570 B1 | 7/2010 | Walker | |
| 7,814,350 B2 | 10/2010 | Gaskins et al. | |
| 7,953,573 B2 | 5/2011 | Walker | |
| 7,990,776 B2 | 8/2011 | Kim et al. | |
| 8,005,641 B2 | 8/2011 | Walker | |
| 8,040,742 B2 | 10/2011 | Walker | |
| 8,049,145 B1 | 11/2011 | Walker | |
| 8,061,895 B2 | 11/2011 | Tsukude | |
| 8,081,532 B2 | 12/2011 | Walker | |
| 8,210,744 B2 | 7/2012 | Shin et al. | |
| 8,272,781 B2 | 9/2012 | Nale | |
| 8,308,359 B2 | 11/2012 | Walker | |
| 8,497,453 B2 | 7/2013 | Walker | |
| 8,547,759 B2 | 10/2013 | Kadowaki | |
| 8,734,006 B2 | 5/2014 | Crafts et al. | |
| 2004/0042529 A1 | 3/2004 | Covi et al. | |
| 2006/0023546 A1 | 2/2006 | Park | |
| 2008/0018482 A1 | 1/2008 | Chiu et al. | |
| 2013/0247850 A1 * | 9/2013 | Matsuo | F01L 1/34 123/90.11 |
| 2014/0368144 A1 * | 12/2014 | Celik | H02P 6/002 318/400.22 |
| 2016/0054380 A1 * | 2/2016 | Walker | G01R 31/025 324/750.03 |
| 2016/0096442 A1 * | 4/2016 | Lee | B60L 11/1848 320/109 |

OTHER PUBLICATIONS

U.S. Appl. No. 14/484,529, filed Sep. 12, 2014, Walker.
U.S. Appl. No. 14/484,546, filed Sep. 12, 2014, Walker.
U.S. Appl. No. 14/484,575, filed Sep. 12, 2014, Walker.
U.S. Appl. No. 14/484,593, filed Sep. 12, 2014, Walker.
Office Action, dated Aug. 3, 2016, for U.S. Appl. No. 14/484,593.
U.S. Appl. No. 61/971,702, filed Mar. 28, 2014, Walker.
U.S. Appl. No. 14/265,642, filed Apr. 30, 2013, Walker.
U.S. Appl. No. 14/265,653, filed Apr. 30, 2014, Walker.
U.S. Appl. No. 14/265,668, filed Apr. 30, 2014, Walker.
U.S. Appl. No. 14/265,682, filed Apr. 30, 2014, Walker.
U.S. Appl. No. 14/265,729, filed Apr. 30, 2014, Walker.

* cited by examiner

| x | Temp Window | CNT[n:1] | Tmax | Tmin | Tmid |
|---|---|---|---|---|---|
| $2^n$ | $W2^n$ | 11...1111 | $T2^n\,max$ | $T2^n\,min$ | $T2^n\,mid$ |
| $2^n-1$ | $W2^n-1$ | 11...1110 | $T2^n-1\,max$ | $T2^n-1\,min$ | $T2^n-1\,mid$ |
| ⋮ | ⋮ | ⋮ | ⋮ | ⋮ | ⋮ |
| 9 | W9 | 00...1000 | T9max | T9min | T9mid |
| 8 | W8 | 00...0111 | T8max | T8min | T8mid |
| 7 | W7 | 00...0110 | T7max | T7min | T7mid |
| 6 | W6 | 00...0101 | T6max | T6min | T6mid |
| 5 | W5 | 00...0100 | T5max | T5min | T5mid |
| 4 | W4 | 00...0011 | T4max | T4min | T4mid |
| 3 | W3 | 00...0010 | T3max | T3min | T3mid |
| 2 | W2 | 00...0001 | T2max | T2min | T2mid |
| 1 | W1 | 00...0000 | T1max | T1min | T1mid |

FIG. 8

TESTING AND SETTING PERFORMANCE PARAMETERS IN A SEMICONDUCTOR DEVICE AND METHOD THEREFOR

This application claims the benefit of U.S. Provisional Patent Application Ser. No. 62/039,494, filed Aug. 20, 2014, the contents of which are incorporated by reference herein.

TECHNICAL FIELD

The present invention relates generally to a semiconductor device, and more particularly to testing and setting performance parameters in a semiconductor device.

BACKGROUND OF THE INVENTION

Semiconductor devices include components that have characteristics that vary with respect to temperature. For example, as temperature increases mobility of charge carriers decreases causing transistors, such as insulated gate field effect transistors (IGFETs) to have lower drive current. Although drive current decreases, leakage current (leakage current when the IGFET is turned off) increases. These temperature dependent characteristics can make design problematic.

When designing a semiconductor device, the designer will design circuit timing and internally regulated power supply voltages for worst case corners. Typically, a fast corner may be high voltage, low temperature and a slow corner may be low voltage and high temperature. By designing circuits in a semiconductor device for a worst case temperature, power may be unnecessarily wasted at another temperature point. For example, a power supply may provide a voltage that is unnecessarily high at a first temperature point due to the necessity of ensuring specifications are met at a second temperature point, even though the semiconductor device rarely operates at the second temperature point. This can cause power to be wasted at the first temperature point, which is where the semiconductor device typically operates.

A specific example is an internal refresh operation in a dynamic random access memory (DRAM). At a low temperature, charge on a DRAM capacitor in a DRAM memory cell may degrade more slowly than at high temperature. However, to ensure specifications are met, the frequency of refresh operations may be unnecessarily high at low temperatures to ensure the high temperature case is met. This can cause unnecessary power consumption in typical operating temperatures.

Unnecessary power consumption is even more important in mobile devices as it reduces battery lifetime.

In light of the above, it would be desirable to provide a semiconductor device in which parameters may be varied with respect to operating temperature.

BRIEF DESCRIPTION OF THE DRAWINGS

FIG. 8 is a table stored in a test control apparatus according to an embodiment.

DETAILED DESCRIPTION OF THE EMBODIMENTS

According to the embodiments set forth below, a semiconductor device can include a temperature sensing circuit that provides a temperature range in accordance with the value of a counter. A counter may incrementally change in accordance with a temperature of the semiconductor device changing outside of the bounds of the range. The count output of the counter can be fed back to the temperature sensing circuit such that the temperature range can change. Furthermore, the value of the counter may select parameters stored in a table to set performance parameters of various operational circuits. A test can be performed over a temperature range to determine minimum and maximum temperature values for each of the plurality of ranges. Furthermore, a test may be performed to determine performance parameters essentially optimized for each temperature range. The optimization may be performed for improved power consumption for a low power device or improved operational speeds for a high speed device.

Figure 1:
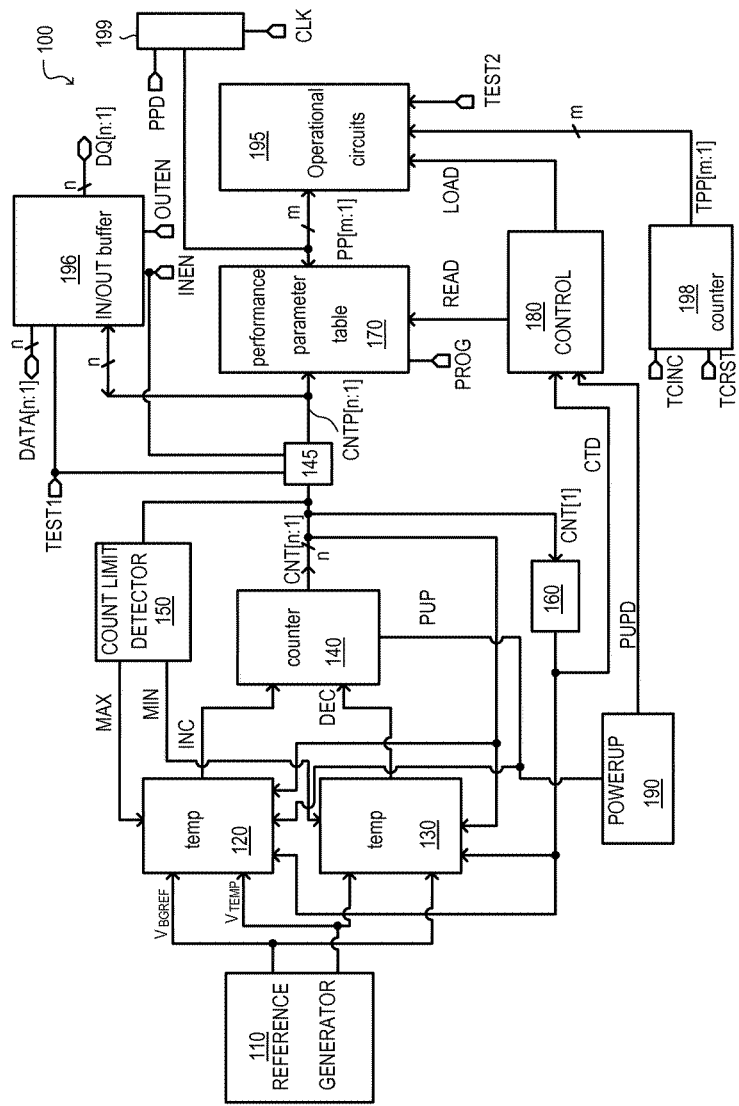
FIG. 1 is a block schematic diagram of a semiconductor device according to an embodiment.

Referring now to FIG. 1, a semiconductor device according to an embodiment is set forth in a block schematic diagram and given the general reference character 100.

Semiconductor device 100 may include a reference voltage generator 110, temperature sensor circuits (120 and 130), and a counter circuit 140. Semiconductor device 100 may also include a pass gate circuit 145, count limit detector 150, a transition detector 160, a performance parameter table 170, a control circuit 180, a power up circuit 190, operational circuits 195 input/output buffer circuit 196, counter circuit 198, and serial register circuit 199.

Voltage generator 110 may provide a reference voltage $V_{BGREF}$ and a reference voltage $V_{TEMP}$. Reference voltage $V_{BGREF}$ may be a reference potential that is essentially independent of temperature. Reference voltage $V_{BGREF}$ may be provided as a reference potential to temperature sensor circuits (120 and 130). Reference voltage $V_{TEMP}$ may be provided as a temperature dependent potential to temperature sensor circuits (120 and 130).

Temperature sensor circuit 120 may receive reference voltages ($V_{BGREF}$ and $V_{TEMP}$), count limit signal MAX, count transition signal CTD, power up signal PUP, and count value CNT[n:1] as inputs and may provide an increment signal INC as an output. Temperature sensor circuit 130 may receive reference voltages ($V_{BGREF}$ and $V_{TEMP}$), count limit signal MIN, count transition signal CTD, power up signal PUP, and count value CNT[n:1] as inputs and may provide decrement signal DEC as an output. Temperature sensor circuit 120 may provide a temperature range upper limit value based on the count value CNT[n:1] and temperature sensor circuit 130 may provide a temperature range lower limit value based on the count value CNT[n:1]. Temperature sensor circuit 120 may provide an increment signal INC that transitions to a logic high level in response to sensing a temperature of semiconductor device 100 reaching the temperature range upper limit value from within the current temperature range. Temperature sensor circuit 130 may provide a decrement signal DEC that transitions to a logic high level in response to sensing a temperature of semiconductor device 100 reaching the temperature range lower limit value from within the current temperature range.

Counter circuit 140 may receive increment signal INC, decrement signal DEC, and power up signal PUP as inputs and may provide count value CNT[n:1] as an output. Counter circuit 140 may incrementally increase count value CNT[n:1] in response to increment signal INC transitioning from a logic low to a logic high level and may incrementally decrease count value CNT[n:1] in response to decrement signal DEC transitioning from a logic low to a logic high level.

Pass gate circuit 145 may receive count value CNT[n:1], test signal TEST1, and input enable signal INEN as inputs and may have an output connected to count value CNTP[n:1]. Pass gate circuit 145 may provide a low impedance path between count values (CNT[n:1] and CNTP[n:1]) when enabled and may provide a high impedance path between count values (CNT[n:1] and CNTP[n:1]) when disabled. Pass gate circuit 145 may be disabled when test signal TEST1 and input enable signal INEN are both logic high levels and may be enabled otherwise. Test signal TEST1 and input enable signal INEN may be received as inputs at pass gate control terminals.

Count limit detector 150 may receive count value CNT[n:1] and may provide count limit signals (MAX and MIN) as outputs. Count limit signal MAX may transition from a logic low to a logic high level when count value CNT[n:1] has a maximum allowed value. Count limit signal MIN may transition from a logic low to a logic high level when count value CNT[n:1] has a minimum allowed value. Count limit signal MAX may disable temperature sensor circuit 120 when at a logic high level. Count limit signal MIN may disable temperature sensor circuit 130 when at a logic high level. In this way, counter circuit 140 may be prevented from rolling over from all zeroes to all ones and vice-versa.

Transition detector 160 can receive the least significant bit CNT[1] from count value CNT[n:1] and may provide a count transition signal CTD. Count transition signal CTD may be a pulse signal generated in response to a logic transition in the least significant bit CNT[1] from count value CNT[n:1]. Count transition signal CTD may be provided to temporarily disable temperature sensor circuits (120 and 130). In this way, glitches may be prevented when transitioning from a first temperature window to a second temperature window. Count transition signal CTD may also be provided to control circuit 180 such that read signal READ and load signal LOAD may be generated to provide performance parameters PP[m:1] to operational circuits 195, and respectively latch the performance parameters to provide to performance parameter adjusted circuits.

Performance parameter table 170 may receive count value CNT[n:1], a read signal READ, and a program signal PROG as inputs and may provide performance parameters PP[m:1] as an output. Performance parameters PP[m:1] may include m bits. Performance parameter table 170 may include a non-volatile memory array providing performance parameters PP[m:1] in accordance to an address corresponding to the value of count value CNTP[n:1] in response to read signal READ.

Control circuit 180 may receive a power up signal PUPD and count transition signal CTD and may provide read signal READ and a load signal LOAD as outputs. Power up circuit 190 may provide power up signals (PUP and PUPD) as outputs in response to power being applied to semiconductor device 100.

Operational circuits 195 may receive performance parameters PP[m:1], test signal TEST2, test performance parameters TPP[m:1], and load signal LOAD. Operational circuits 195 may latch performance parameters PP[m:1] into latches in response to load signal LOAD. The latched performance parameters may modify the operation of circuitry, for example, increase or decrease time delays, change the magnitude of potential levels, and/or vary threshold voltages in IGFETs, as just a few examples. In this way, circuitry in operational circuits 195 may operate over a large temperature range without unduly wasting power or adversely affecting speed at one temperature in order to provide functionality margin at another temperature.

IN/OUT buffer circuit 196 may receive a test signal TEST1, input enable signal INEN, and output enable signal OUTEN as an input and may receive or provide count value CNTP[n:1] and data DATA[n:1] on bidirectional data lines. IN/OUT buffer circuit 196 may output data DATA[n:1] to data signals DQ[n:1] when output enable signal OUTEN is enabled (logic high) and test signal TEST1 is disabled (logic low) and may output count value CNTP[n:1] to data signals DQ[n:1] when output enable signal OUTEN is enabled (logic high) and test signal TEST1 is enabled (logic high). IN/OUT buffer circuit 196 may act as an input buffer to provide data signals DQ[n:1] to bidirectional data lines DATA[n:1] when input enable signal INEN is enabled (logic high) and test signal TEST1 is disabled (logic low) and may provide data signals DQ[n:1] to count value CNTP[n:1] when input enable signal INEN is enabled (logic high) and test signal TEST1 is enabled (logic high).

Counter circuit 198 may receive test count increment signal TCINC and test count reset signal TCRST as inputs and may provide test performance parameters TPP[m:1] as outputs. Counter circuit 198 may provide test performance parameters during a test mode to optimize the operation of operational circuits in semiconductor device 100. Counter circuit 198 may be reset in response to test count reset signal TCRST transitioning from a logic low to a logic high level. The value of test performance parameters TPP[m:1] may be reset to have a value of "00 . . . 000" when reset and may be incremented in response to the test count increment signal TCINC transitioning from a logic low to a logic high level.

Serial register 199 may receive a clock signal CLK and performance parameter data PPD as inputs and may provide performance parameters PP[m:1] to be programmed into performance parameter table 170. Serial register 199 may allow a tester to input performance parameter data PPD serially on a single input pin and write the performance parameters PP[m:1] into a row of memory in performance parameter table 170 as selected by count value CNTP[n:1] in response to a program signal PROG.

Figure 2:
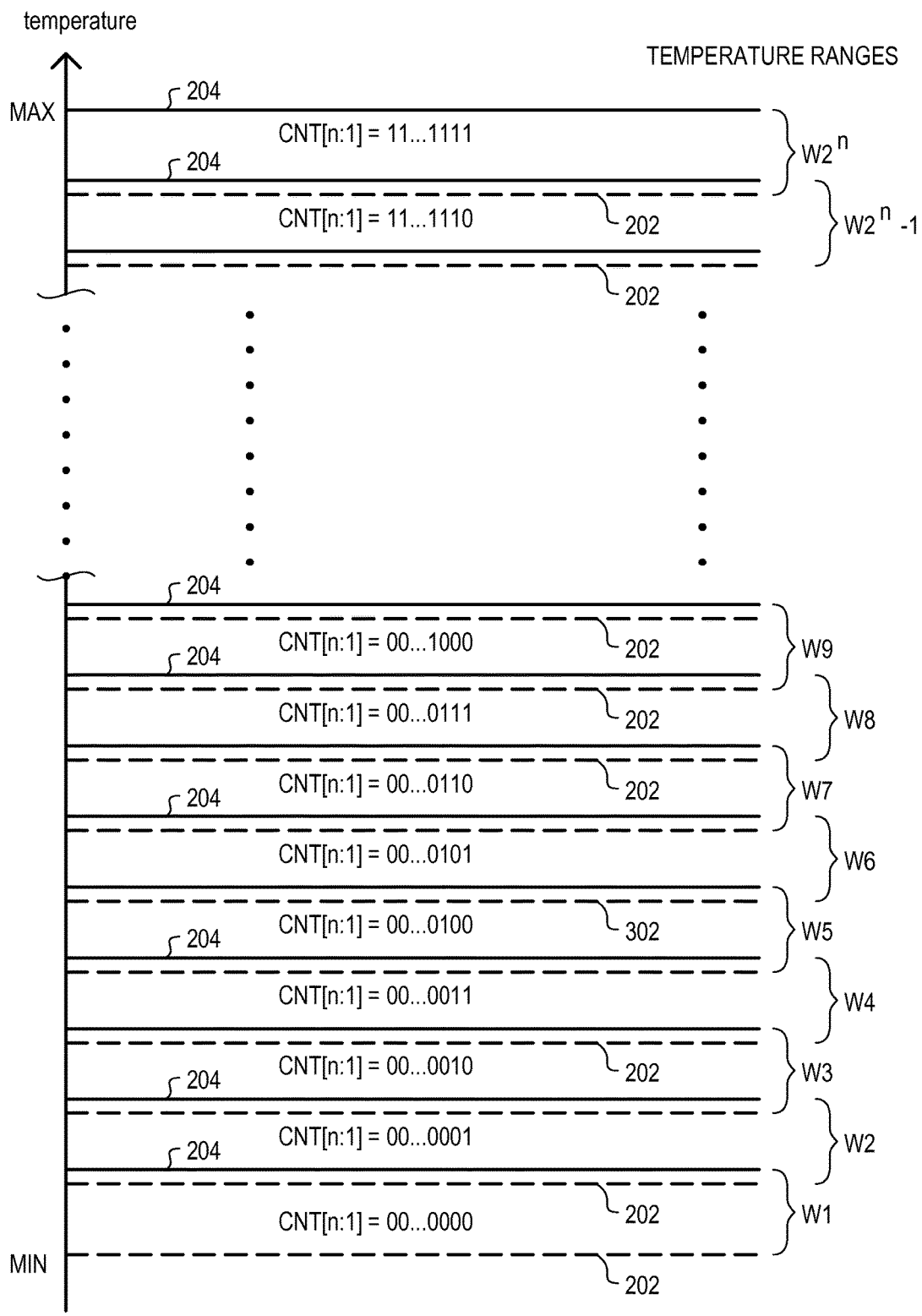
FIG. 2 is a circuit schematic diagram of temperature ranges set by temperature sensor circuits according to an embodiment.

Referring now to FIG. 2, a diagram of temperature ranges set by temperature sensor circuits (120 and 130) according to an embodiment is set forth. The diagram of FIG. 2 illustrates the temperature ranges that can correspond to each count value CNT[n:1]. Each temperature range (W1 to W2″), where n is the number of bits in count value CNT[n:1]), can include a temperature range upper limit value 204 (illustrated by a solid line) and an temperature range lower limit value 202 (illustrated by a dashed line). The temperature range upper limit value 204 may be set by the count value CNT[n:1] by a resistance value of a variable resistor (not shown) in temperature sensor circuit 120. The temperature range lower limit value 202 may be set by the count value CNT[n:1] by a resistance value of a variable resistor (not shown) in temperature sensor circuit 130. It is noted that each temperature range (W1 to W2″) can overlap with an adjacent temperature range (W1 to W2″). For example, the temperature range upper limit value of temperature range W5 can overlap the temperature range lower limit value of temperature range W6 and the temperature range lower limit value of temperature range W5 can overlap the temperature range upper limit value of temperature range W4. In other words, the temperature range upper limit value 204 of temperature range W4 and the temperature range lower limit value 202 of temperature range W6 can both fall within temperature range W5.

Each respective value of count value CNT[n:1] can set resistance values of variable resistors so that the increment signal INC may transition from a low logic level to a high logic level when the temperature of the semiconductor device 100 transitions from within the set temperature range (W1 to W2″) to the temperature range upper limit value and so that the decrement signal DEC may transition from a low logic level to a high logic level when the temperature of the semiconductor device 100 transitions from within the set temperature range (W1 to W2‴) to the temperature range lower limit value.

Having a unique value for the count value CNT[n:1] allows performance parameters PP[m:1] to be latched in latches included in operational circuits 195 as latched performance parameters and provided to performance parameter adjusted circuits. In this way, performance parameter adjusted circuits may functionally operate in each temperature range (W1 to W2″) without the necessity of providing undue margin at one temperature of operation in order to satisfy another temperature of operation.

Temperature ranges (W1 to W2″) may be conceptualized as temperature windows.

The operation of reference generator circuit 110, temperature sensor circuits (120 and 130), counter circuit 140, count limit detector 150, transition detector 160, and control circuit 180 are described in detail in U.S. patent application Ser. Nos. 14/265,642, 14/265,653, 14/265,668, 14/265,682, and 14/265,729, all filed Apr. 30, 2014 and all incorporated herein by reference.

Figure 3:
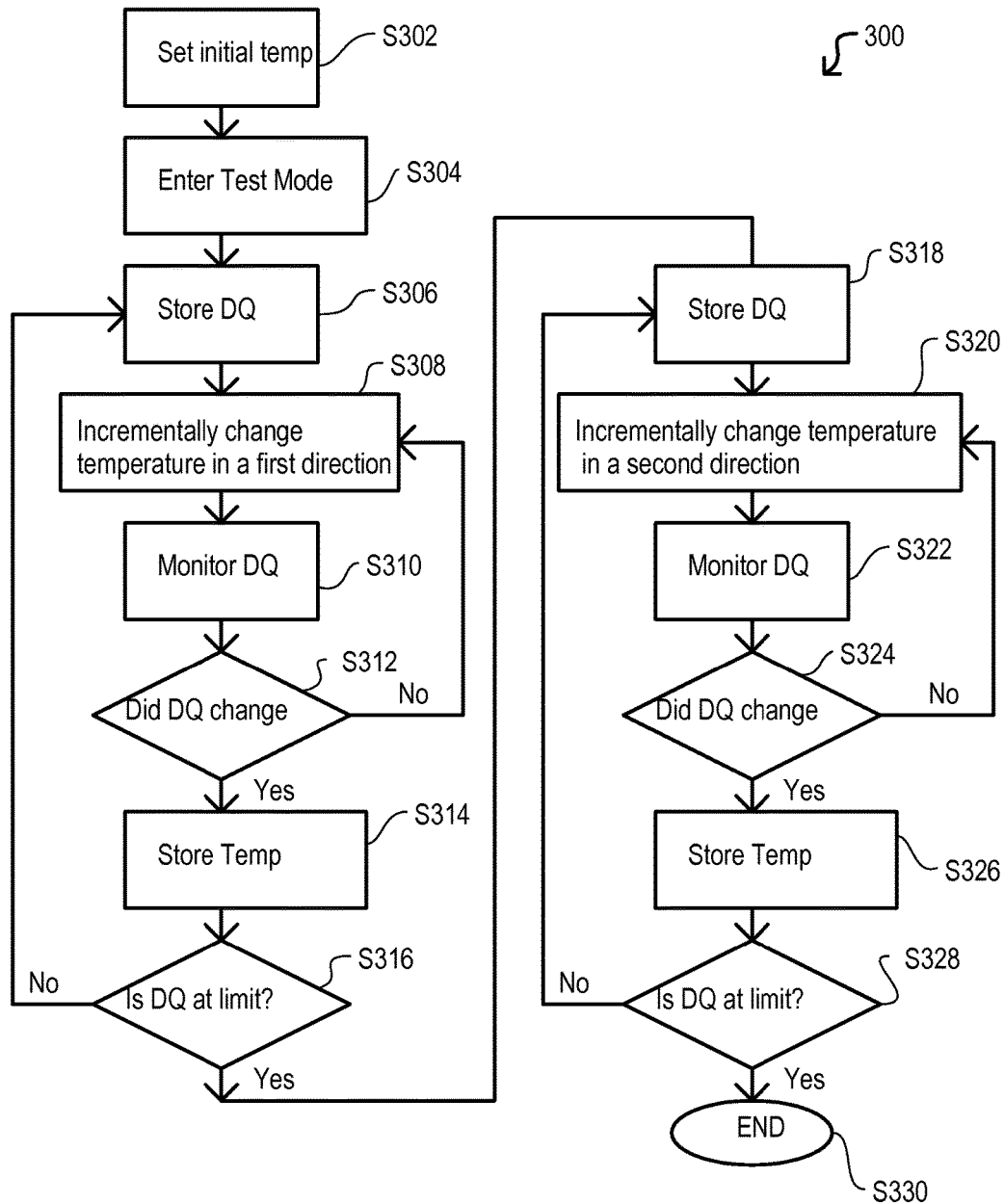
FIG. 3 is a flow diagram of a test method for a semiconductor device according to an embodiment.

FIG. 3 is a test method for a semiconductor device according to an embodiment set forth in a flow diagram and given the general reference character 300.

Test method 300 illustrates a test method for determining temperature range upper limit values 204 and temperature range lower limit values 202 for temperature windows (W1 to W2″).

Figure 4:
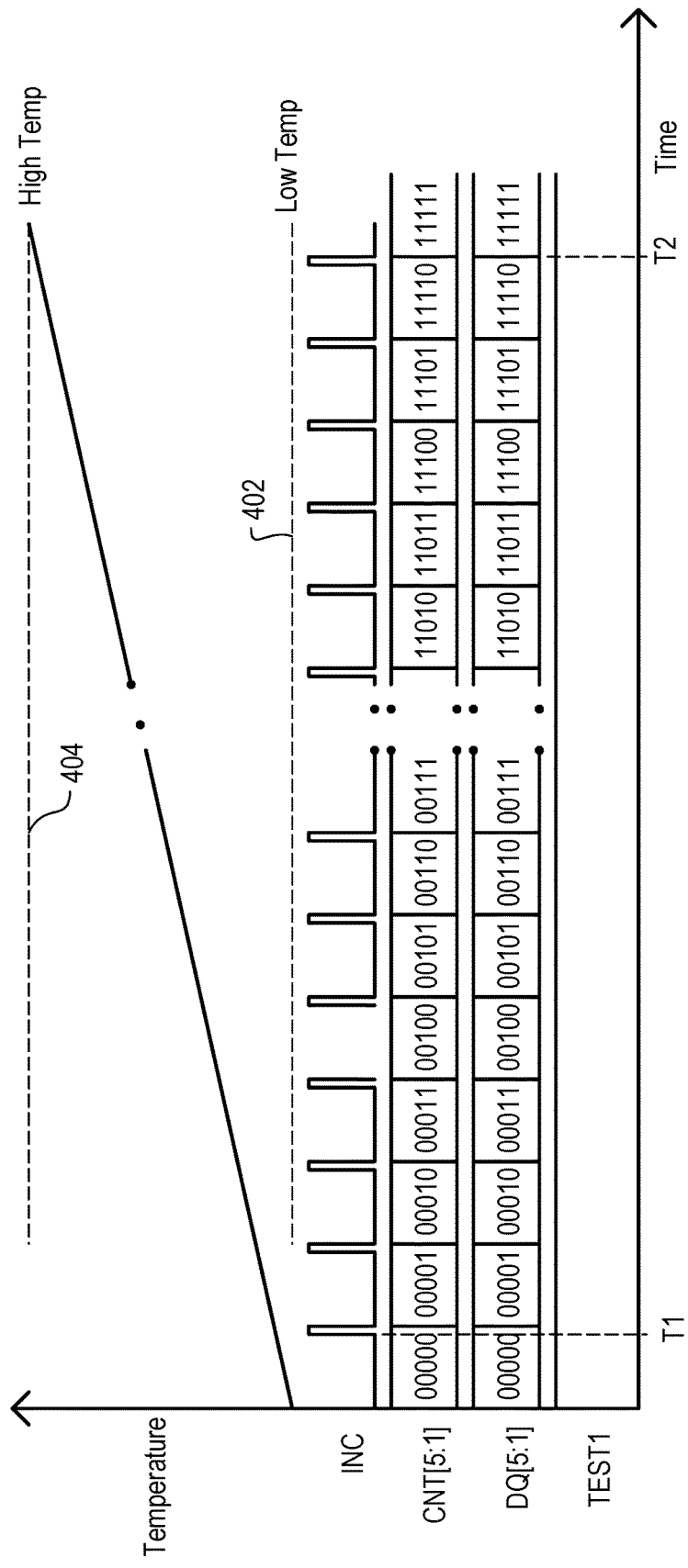
FIG. 4 is a waveform diagram illustrating a test method for a semiconductor device according to an embodiment.

FIG. 4 is a waveform diagram illustrating a test method for a semiconductor device according to an embodiment.

The waveform diagram of FIG. 4 includes waveforms of the temperature Temperature, increment signal INC, count value CNT[5:1], data DQ[5:1], and test signal TEST1 A portion of test method 300 will now be explained with reference to FIGS. 1 to 4.

An initial temperature may be set for semiconductor device 100 in a step S302. The temperature value may be provided by a temperature chuck if the semiconductor device 100 is still integrally disposed on a semiconductor wafer, may be provided with a thermally conductive substance in direct contact with a heat spreader on a packaged semiconductor device 100 or as a temperature in an oven, such as a burn-in oven in which the semiconductor device 100 is set within a test socket, as just a few examples.

The initial temperature can be set at a low temperature 402 illustrated in FIG. 4. FIG. 4 sets forth waveforms for temperature TEMPERATURE, increment signal INC, count value CNT[5:1] (for counter 140 being a 5-bit counter), data signal DQ[5:1], and test signal TEST1 In a step S304, a test mode of operation may be entered. The test mode of operation may be entered by providing an overvoltage or undervoltage (e.g. a potential outside of specification) to an address pin of semiconductor device 100 in conjunction with a predetermined combination of command signals, and/or address and data signals to semiconductor device 100.

In response to entering the test mode of operation, test signal TEST1 may transition from a logic low level to a logic high level. With test mode at a logic high level, IN/OUT buffer circuit 196 may provide count value CNT[5:1] as data signal DQ[5:1] when output enable signal OUTEN is in an enable state instead of data DATA[5:1] as in normal operation. When output signal OUTEN is in a disable state, IN/OUT buffer circuit 196 may provide a high impedance state. It is noted that data signal DQ[5:1] is provided externally to/from semiconductor device 100 by way of a pad, pin, solder bump, or the like, as just a few examples.

The value of low temperature 402 may be such that the temperature may be at or below the lower limit value 202 of temperature range W1.

With the temperature set at the low temperature 402, counter 140 may provide a count value CNT[5:1] being "00000", which may be provided as data signal DQ[5:1] by IN/OUT buffer circuit 196.

In a step S306, the value of data DQ[5:1] may be stored in memory of a test apparatus.

In a step S308 the temperature may be changed in a first direction (in this case the temperature may be incrementally increased. Data DQ[5:1] may be monitored in step S310. In step S312, data signal DQ[5:1] may be checked for a value change (for example, from "00000" to "00001"). If the value of data DQ[5:1] has not changed then steps (S308 to S312) may be repeated until the temperature reaches the temperature range upper limit value (for example, temperature range upper limit value 204 of temperature range W1 when count value CNT[5:1] has a value of "00000"). Eventually at time T1 (FIG. 4), temperature sensor circuit 120 may detect a temperature range upper limit value and increment signal INC may pulse high. Counter circuit 140 may increment in response to increment signal INC to provide a count value CNT[5:1] of "00001", which may be provided at data DQ[5:1] by way of input/output buffer circuit 196. In this way, when the temperature has reached the temperature range upper limit value, counter circuit 140 may provide a count value CNT[5:1] being "00001", which may be provided at data DQ[5:1] by way of input/output buffer circuit 196. When data DQ[5:1] changes to "00001", indicating the temperature range upper limit value 204 of temperature range W1 has been reached, the test method 300 may go to step S314 and the temperature (corresponding to the temperature range upper limit value 204 of temperature range W1) may be stored in the memory of the test apparatus.

At step S316, a determination may be made whether or not the data signal DQ[5:1] (count value CNT[5:1]) is at a limit (in this case, a maximum limit of "11111"). Because the data DQ[5:1] is at a value of "00001", the test method 300 may return to step S308 and steps (S308 to S316) may be repeated as described above until all the temperature range upper limit values 204 of temperature ranges (W1 to W2"-1) have been stored in the memory of the test apparatus. At this time T2 (FIG. 4), data DQ[5:1] may have a value of "11111" and the test method 300 may proceed to step S318.

Figure 5:
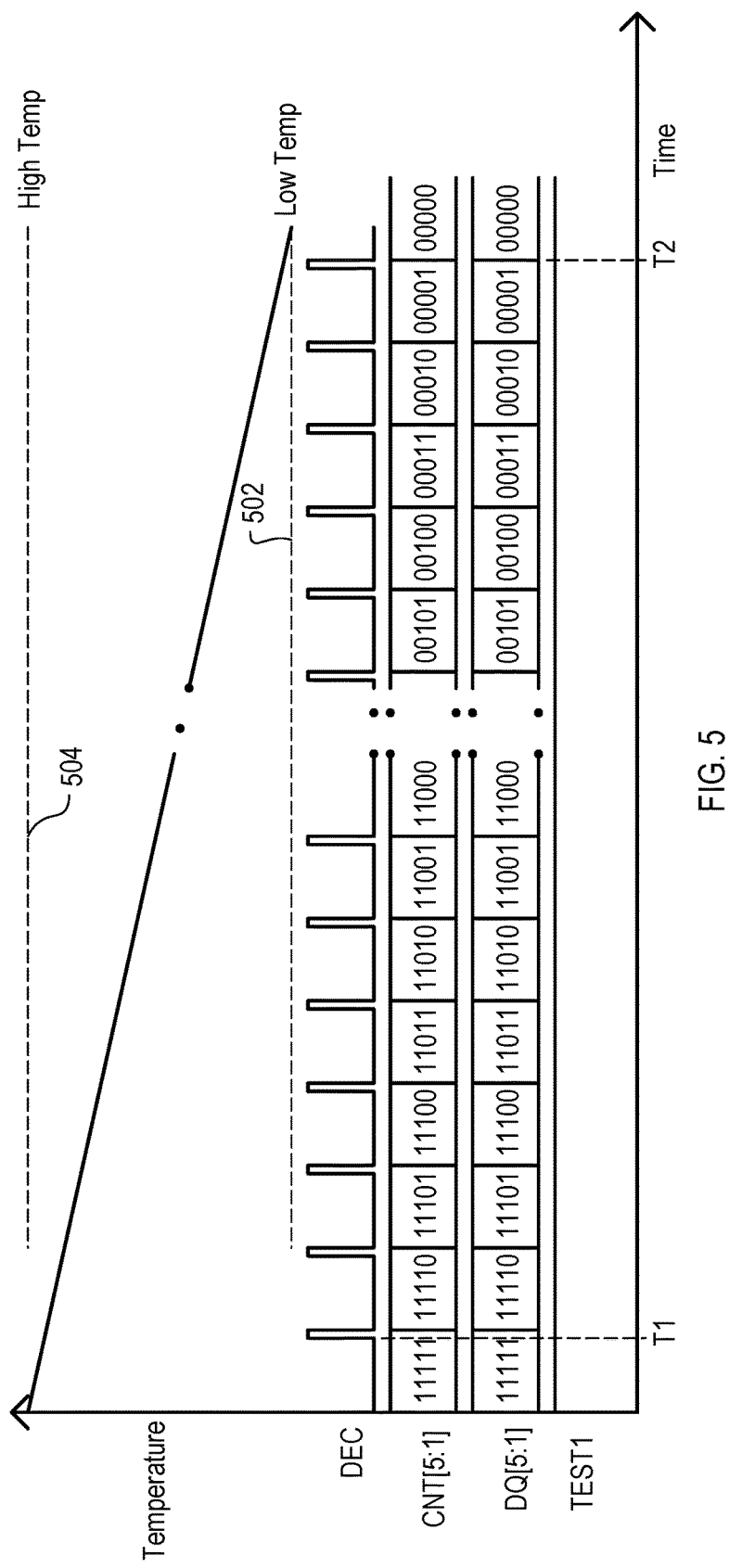
FIG. 5 is a waveform diagram illustrating a test method for a semiconductor device according to an embodiment.

FIG. 5 is a waveform diagram illustrating a test method for a semiconductor device according to an embodiment.

A portion of test method 300 will now be explained with reference to FIGS. 1, 2, 3, and 5.

The waveform diagram of FIG. 5 includes waveforms of the temperature Temperature, decrement signal DEC, count value CNT[5:1], data DQ[5:1], and test signal TEST1.

At step S318, the temperature of the semiconductor device 100 may essentially be at the temperature range upper limit value of temperature range W2"-1. Data DQ[5:1] having a value of "11111" may be stored at this time. At a step S320, the temperature may be incrementally changed in a second direction (incrementally decreased). Data DQ[5:1] may be monitored at step S322. At step S324, a determination may be made as to whether the value of data DQ[5:1] has changed (through counter circuit 140 decrementing). If data DQ[5:1] has not changed, steps (S320 and S322) may be repeated. Eventually at time T1 (FIG. 5), temperature sensor circuit 130 may detect a temperature range lower limit value and decrement signal DEC may pulse high. Counter circuit 140 may decrement in response to decrement signal DEC to provide a count value CNT[5:1] of "11110", which may be provided at data DQ[5:1] by way of input/output buffer circuit 196. When data DQ[5:1] changes to "11110", indicating the temperature range lower limit value 202 of temperature range W2" has been reached, the test method 300 may go to step S326 and the temperature (corresponding to the temperature range lower limit value 202 of temperature range W2") may be stored in the memory of the test apparatus.

At step S328, a determination may be made whether or not the data signal DQ[5:1] (count value CNT[5:1]) is at a limit (in this case, a minimum limit of "00000"). Because the data DQ[5:1] is at a value of "11110", the test method 300 may return to step S318 and steps (S318 to S328) may be repeated as described above until all the temperature range lower limit values 202 of temperature ranges (W2" to W1) have been stored in the memory of the test apparatus. At this time T2 (FIG. 5), data DQ[5:1] may have a value of "00000" and the test method 300 may proceed to step S330. At this time all the temperature range upper limit values 204 and temperature range lower limit values 202 may be stored in the memory of a test apparatus for each temperature range (W1 to W2").

Figure 6:
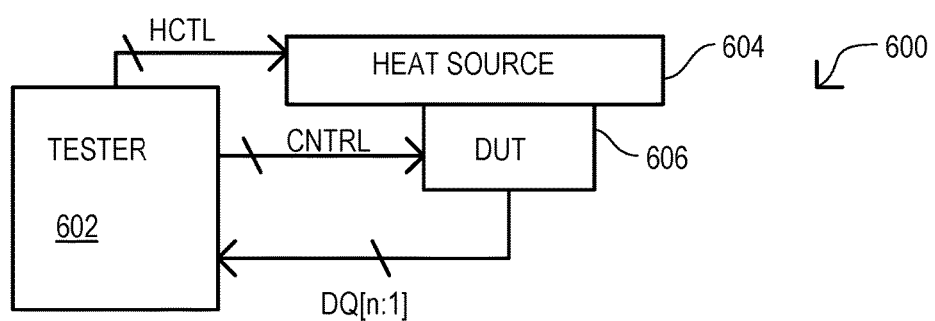
FIG. 6 is a block schematic diagram illustrating a test apparatus that can test a semiconductor device according to an embodiment.

Referring now to FIG. 6, a block schematic diagram illustrating a test apparatus that can test a semiconductor device according to an embodiment is set forth and given the general reference character 600. The test apparatus 600 can include a test control apparatus 602, a thermal source 604, and a device under test 606. Device under test 606 may be semiconductor device 100 of FIG. 1. Test apparatus may be used to perform the test method 300 illustrated in FIG. 3.

Test control apparatus 602 can provide temperature control signals HCTL on a bus received by thermal source 604. Test control apparatus 602 may also provide control signals CNTRL to the device under test 606. Control signals CNTRL may include address signals, command signals, and/or data signals or the like for operating device under test 606. Test control apparatus 602 may also provide and/or receive data DQ[n:1]. Thermal source 604 may provide a predetermined temperature value to device under test 604 in response to temperature control signals HCTL. Device under test 606 may receive control signals CNTRL from test control apparatus 602 and may provide and/or receive data DQ[n:1].

Figure 7:
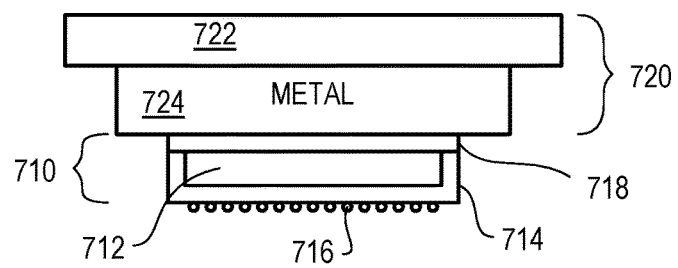
FIG. 7 is a schematic diagram illustrating a thermal source and a device under test according to an embodiment.

Referring now to FIG. 7, a schematic diagram illustrating a thermal source and a device under test according to an embodiment is set forth and given the general reference character 700.

The schematic diagram of FIG. 7 can include a device under test 710 and a thermal source 720. The device under test 710 can be a packaged semiconductor device, such as semiconductor device 100 of FIG. 1. Thermal source 720 can be thermal source 604 of FIG. 6.

Device under test 710 can include a semiconductor integrated circuit 712, encapsulation material 714, contact bumps 716, and a heat spreader 718. Heat spreader 718 may be in thermal contact with thermal source 720 and semiconductor integrated circuit 712.

Thermal source 720 may include thermal controller 722 and thermally conductive metal 724. Thermal controller 722 may provide a predetermined temperature value to thermally conductive metal 724 in response to temperature control signals HCTL provided from test control apparatus 602.

In this way, a test apparatus may provide a predetermined temperature to a semiconductor integrated circuit 712 by providing the predetermined temperature to a thermally conductive metal 724 in direct contact with a heat spreader 718 that is in contact with a semiconductor integrated circuit 712 and a thermal test method may be performed.

Referring now to FIG. 8, a table stored in test control apparatus according to an embodiment is set forth. The table of FIG. 8, can include a column x showing the number of temperature ranges or windows. Column x can include digits 1 to $2^n$, for a counter 140 having n-bits. X can be conceptualized as a pointer. A temperature window or range column Temp Window can have temperature windows or ranges (W1 to W2"). A column CNT[n:1] can have count values (00 . . . 0000 to 11 . . . 111), each count value can correspond to a respective temperature window or range (W1 to W2").

A temperature window upper limit value column Tmax may include values (T1max to T2"max) for temperature range upper limit values 204 for each respective temperature window or range (W1 to W2") as determined in test method 300. A temperature window lower limit value column Tmin may include values (T1min to T2"min) for temperature range lower limit values 202 for each respective temperature window or range (W1 to W2") as determined in test method 300. A temperature window midpoint value column Tmid may include values (T1mid to T2"mid) for temperature range midpoint values for each respective temperature window or range (W1 to W2"). The temperature range midpoint values may be essentially an average of a temperature range upper limit value 204 and a temperature range lower limit value 202 for a respective temperature window or range (W1 to W2").

A semiconductor device 100 may be optimized for speed performance or low power consumption depending on the desired application by a vendor. For example, a mobile device manufacturer may desire semiconductor device 100 to operate using as little power as feasible while meeting minimum speed specifications and a high performance computer manufacturer may desire semiconductor device 100 to operate as fast as feasible while meeting maximum power specifications.

Figure 9:
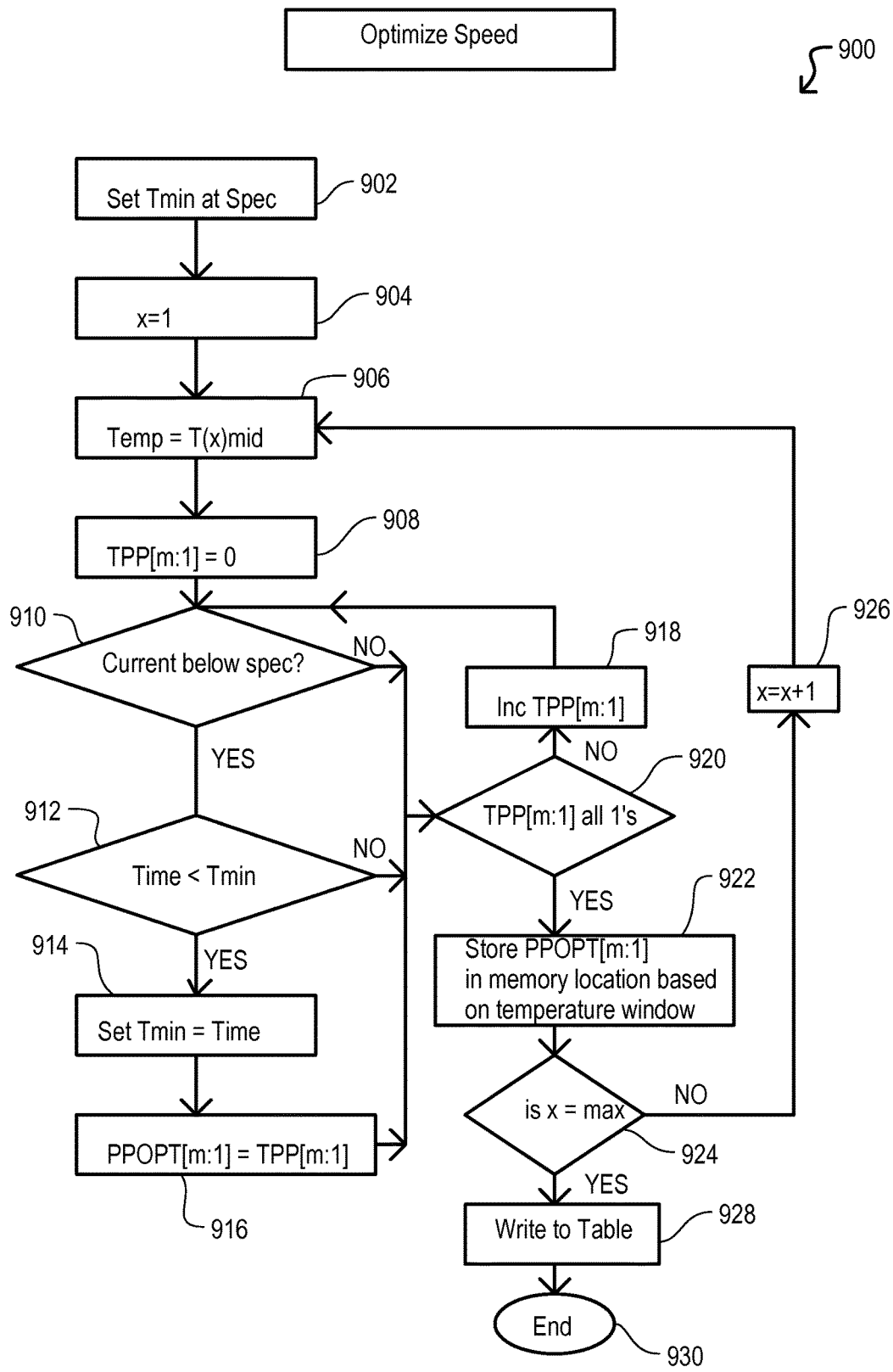
FIG. 9 is a flow diagram of a method of optimizing speed performance over a wide range of temperatures according to an embodiment.

In FIG. 9, a method of optimizing speed performance over a wide range of temperatures is set forth in a flow diagram and given the general reference character 900.

Figure 10:
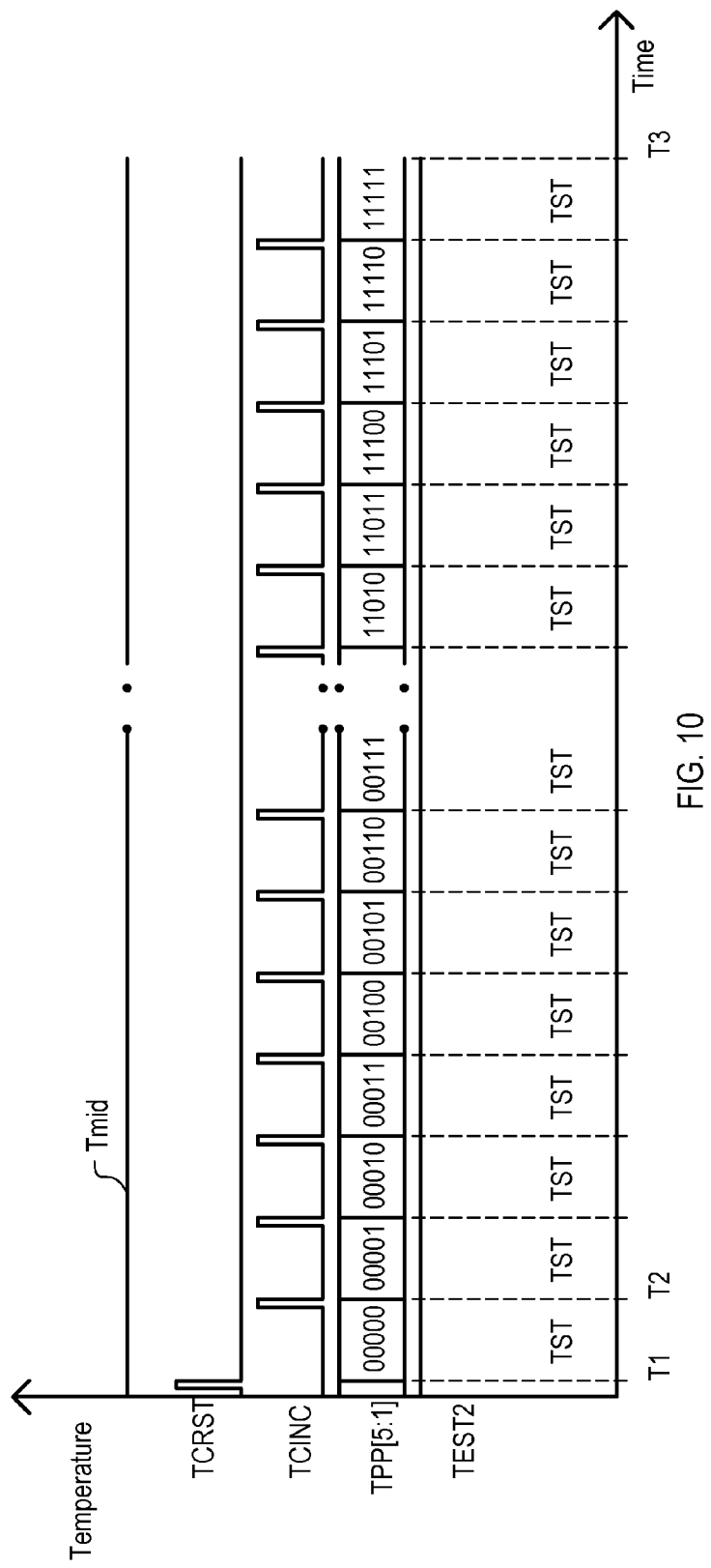
FIG. 10 is a timing diagram illustrating a portion of a test method for testing a semiconductor device according to an embodiment.

FIG. 10, is a timing diagram illustrating a portion of a test method for testing a semiconductor device, such as semiconductor device 100.

The timing diagram of FIG. 10 includes a temperature value Temperature, test count reset signal TCRST, test count increment signal TCINC, performance parameters TPP[5:1] (for a 5-bit performance parameter, as an example, m=5), and a test signal TEST2.

Referring now to FIG. 9 in conjunction with FIG. 10.

Initially, tester 602 may provide control signals CNTRL for device under test 606 to enter a test mode in which test signal TEST2 may be set to a logic high level.

Method 900 may include a step 902 in which a timing may be set at a value Tmin, which is a minimum value according to a desired specification. In a step 904, a pointer x may be set to x=1. In a step 906 the temperature of thermal source 604 can be set to a temperature range midpoint value T1mid (because x=1, Temp=T(x)mid=T1mid).

In a step 908, the test performance parameters TPP[5:1] may be set to all zeroes ("00000"). This may be accomplished as illustrated in FIG. 10 at time T1 in response to a test counter reset signal TCRST pulse. In this way, counter 198 (FIG. 1) may provide test performance parameters TPP[5:1]=00000.

In a step 910 various current values may be checked to see if they are below a maximum specification. Current values may be active current values, standby current values, and sleep current values, as just a few examples. A sleep current value may be when semiconductor device is placed in a sleep mode in which a plurality of input buffers may be turned off, and signals may be internally generated to minimally satisfy basic functionality, for example, an internal refresh clock in a DRAM. If the various current values are below a maximum specification, then method 900 goes to a step 912, otherwise, the method 900 goes to a step 920.

If the current values are below a maximum specification, the method goes to a step 912. In step 912, speed performance is tested. If the speed timing Time is below Tmin, then the new minimum timing Tmin may be set to the speed timing Time, otherwise the method 900 goes to a step 920. It is understood that the timing tested can be various timings and that all timings must be below maximum specifications, however, the timing Time (timing parameter) that is optimized may be an access time or a combination of read and write timing, for example, the summation of the read and write timings, or a clock period time for a synchronously operated device, such as a synchronous memory or a processor, as just two examples.

In a step 916, test performance parameters TPP[5:1], may be stored as optimal test performance parameters PPOPT[5:1]. Next, the method 900 goes to a step 920.

In step 920, test performance parameters TPP[5:1] are checked to see if they have a value of "11111". If they do not, then increment signal TCINC (time T2 of FIG. 10) may be pulsed high in a step 918. In this way, counter 198 may increment test performance parameters TPP[5:1] and test performance parameters TPP[5:1] may have a value of "00001".

Steps (910 to 920) may be repeated until step 920 detects test performance parameters TPP[5:1] having a value of "11111" (time T3 of FIG. 10). In response to test performance parameters TPP[5:1] having a value of "11111", the method 900 goes to a step 922.

In step 922, optimal test performance parameters PPOPT[5:1] may be stored in a memory location within tester 602 based on the value of x (in this case x=1) indicating the temperature window Wx in this case temperature window W1.

In step 924, x is checked to see if it is a maximum value (i.e. the last temperature window W2"). If x is not at a maximum value, the method 900 goes to a step 926.

In step 926, x is incremented by 1 and the method 900 returns to step 906 and the temperature is set to the next temperature range midpoint value Timid. Steps (906 to 926) are repeated until step 924 detects x at a maximum value (2") and the method 900 goes to step 928. In a step 928, the stored optimal test performance parameters PPOPT[5:1] are written into performance parameter table 170, where each temperature range (window) (W1 to W2") may have values based on the stored optimal test performance parameters PPOPT[5:1] determined by method 900 for each tested temperature range midpoint value Tmid in the table of FIG. 8.

Referring to FIG. 10 in conjunction with FIG. 9, steps (910 to 916) may be performed between time T1 and T2 (shown as test TST). Steps (908 to 926) may be performed between time T1 and T3 for setting performance parameters for a temperature range (W1 to W2") in accordance with the test performed at a temperature range midpoint value (T1mid to T2"mid).

Figure 11:
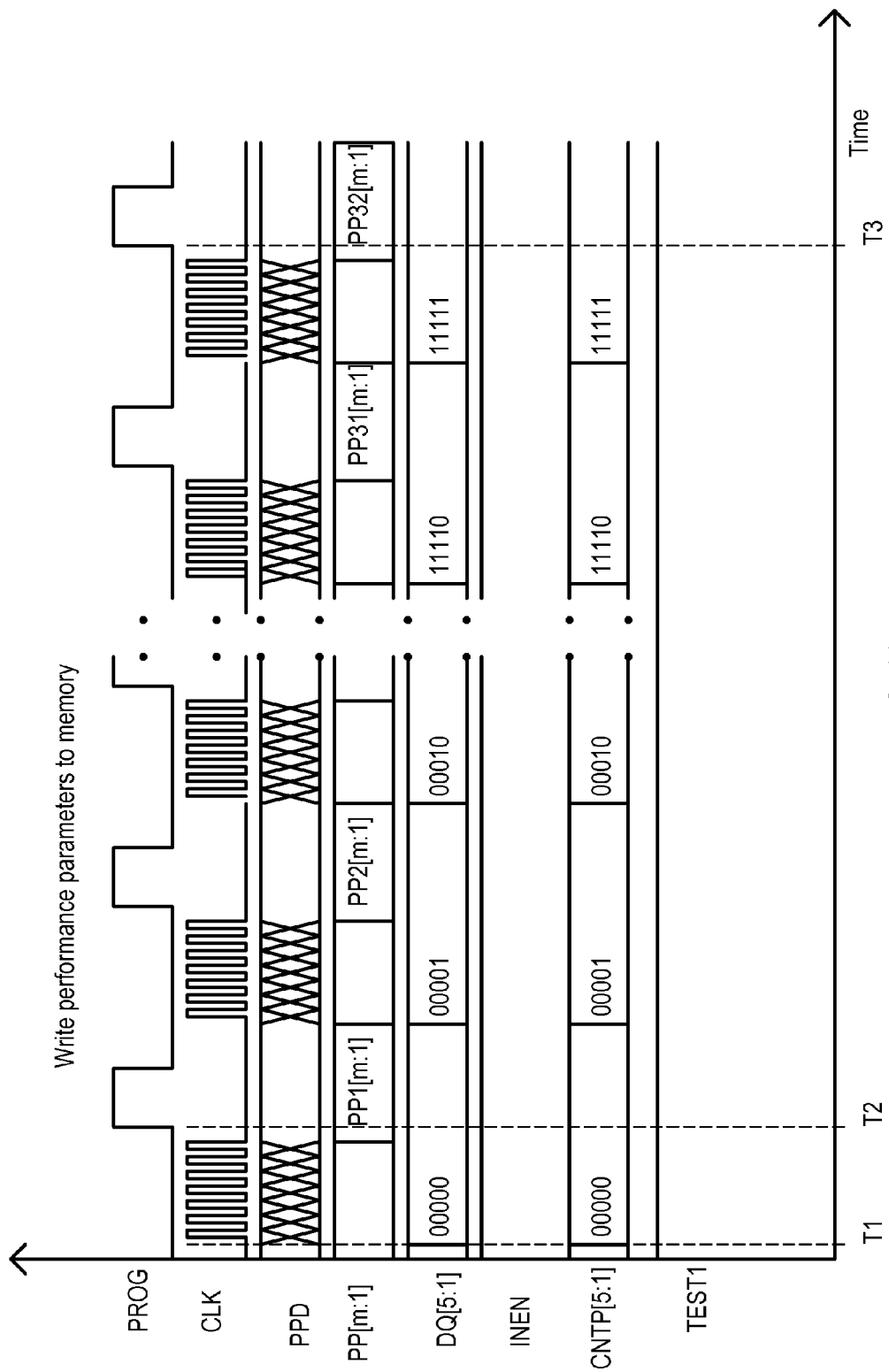
FIG. 11 is a timing diagram illustrating writing performance parameters to a performance parameter table according to an embodiment.

Referring now to FIG. 11, a timing diagram illustrating writing performance parameters to a performance parameter table according to an embodiment is set forth. FIG. 11 illustrates step 928 of method 900 of FIG. 9 in which stored optimal test performance parameters are written into performance parameter table 170.

The timing diagram of FIG. 11 includes a program signal PROG, a clock signal CLK, performance parameter data PPD, performance parameters PP[m:1], data DQ[5:1], input enable signal INEN, count value CNTP[5:1], and test signal TEST1.

At time T1, performance parameter data PPD may be synchronously shifted into serial register 199 in response to clock signal CLK. The performance parameter data PPD may be optimal test performance parameters corresponding to temperature range W1 serially provided in m clock cycles.

Serial register 199 may convert the serially applied performance parameter data into a parallel applied performance parameters PP[m:1].

Data DQ[5:1] may receive a value of "00000" (in this case counter 140 provides a 5-bit count output). With input enable signal INEN having a high logic level, input/output buffer circuit 196 may provide count value CNTP[5:1] having a value of "00000". Note, at this time test signal TEST1 and input enable signal INEN are both logic high levels so that pass gate circuit 145 is in a high impedance state preventing counter circuit 140 from providing count value CNTP[5:1]. At time T2, program signal PROG may pulse high and performance parameters PP[m:1] may be written into a row of non-volatile memory cells selected by count value CNTP[5:1] in performance parameter table 170. In this way performance parameters for temperature range W1 may be written into performance parameter table 170. This operation may be repeated for each corresponding temperature range (W1 to W32, as n=5) until at time T3 in which performance parameters for temperature window W32 is written into performance parameter table 170.

Figure 12:
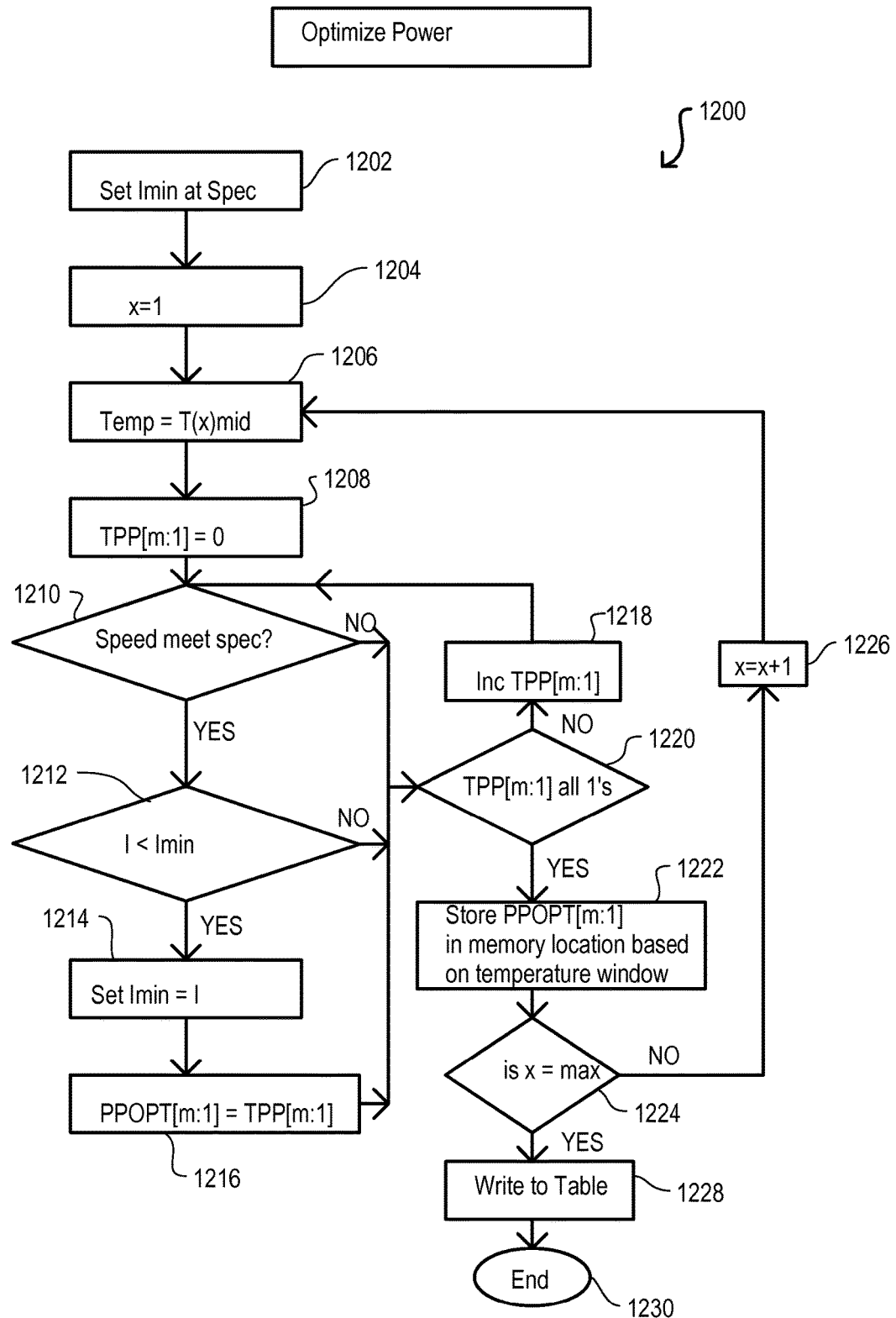
FIG. 12 is a flow diagram of a method of optimizing power consumption over a wide range of temperatures according to an embodiment.

Referring now to FIG. 12, a method of optimizing power consumption over a wide range of temperatures is set forth in a flow diagram and given the general reference character 1200.

Referring now to FIG. 12 in conjunction with FIG. 10.

Initially, tester 602 may provide control signals CNTRL for device under test 606 to enter a test mode in which test signal TEST2 may be set to a logic high level.

Method 1200 may include a step 1202 in which a current (such as an average current) may be set at a value Imin, which is a maximum value acceptable according to a desired specification. In a step 1204, a pointer x may be set to x=1. In a step 1206 the temperature of thermal source 604 can be set to a temperature range midpoint value T1mid (because x=1, Temp=T(x)mid=T1mid). Current values may be active current values, standby current values, and sleep current values, as just a few examples. A sleep current value may be when semiconductor device is placed in a sleep mode in which a plurality of input buffers may be turned off, and signals may be internally generated to minimally satisfy basic functionality, for example, an internal refresh clock in a DRAM.

In a step 1208, the test performance parameters TPP[5:1] may be set to all zeroes ("00000"). This may be accomplished as illustrated in FIG. 10 at time T1 in response to a test counter reset signal TCRST pulse. In this way, counter 198 (FIG. 1) may provide test performance parameters TPP[5:1]=00000.

In a step 1210 various timing values may be checked to see if they are below a maximum specification. If the various timing values are below a maximum specification, then method 1200 goes to a step 1212, otherwise, the method 1200 goes to a step 1220.

If the timing values are below a maximum specification, the method goes to a step 1212. In step 1212, current/power performance is tested. If the current I is below Imin, then the new minimum current value Imin may be set to the test sampled current I at step 1214, otherwise the method 1200 goes to a step 1220. It is understood that the current tested can be various currents and that all currents must be below maximum specifications, however, the current I (current parameter) that is optimized may be an average active current, active standby current, or a combination of active and standby currents, for example, the summation of the active and standby currents.

In a step 1216, test performance parameters TPP[5:1], may be stored as optimal test performance parameters PPOPT[5:1]. Next, the method 1200 goes to a step 1220.

In step 1220, test performance parameters TPP[5:1] are checked to see if they have a value of "11111". If they do not, then increment signal TCINC (time T2 of FIG. 10) may be pulsed high in a step 1218. In this way, counter 198 may increment test performance parameters TPP[5:1] and test performance parameters TPP[5:1] may have a value of "00001".

Steps (1210 to 1220) may be repeated until step 1220 detects test performance parameters TPP[5:1] having a value of "11111". In response to test performance parameters TPP[5:1] having a value of "11111", the method 1200 goes to a step 1222.

In step 1222, optimal test performance parameters PPOPT[5:1] may be stored in a memory location within tester 602 based on the value of x (in this case x=1) indicating the temperature window Wx in this case temperature window W1.

In step 1224, x is checked to see if it is a maximum value (i.e. the last temperature window W2"). If x is not at a maximum value, the method 1200 goes to a step 1226.

In step 1226, x is incremented by 1 and the method 1200 returns to step 1206 and the temperature is set to the next temperature range midpoint value T2mid. Steps (1206 to 1226) are repeated until step 1224 detects x at a maximum value (2") and the method 1200 goes to step 1228. In a step 1228, the stored optimal test performance parameters PPOPT[5:1] are written into performance parameter table 170, where each temperature range (window) (W1 to W2") may have values based on the stored optimal test performance parameters PPOPT[5:1] determined by method 1200 for each tested temperature range midpoint value Tmid in the table of FIG. 8. Step 1228 follows the same writing method as illustrated in FIG. 11 and explained above with step 928 of FIG. 9.

Referring to FIG. 10 in conjunction with FIG. 12, steps (1210 to 1216) may be performed between time T1 and T2 (shown as test TST). Steps (1208 to 1226) may be performed between time T1 and T3 for setting performance parameters for a temperature range (W1 to W2") in accordance with the test performed at a temperature range midpoint value (T1mid to T2"mid).

Figure 13:
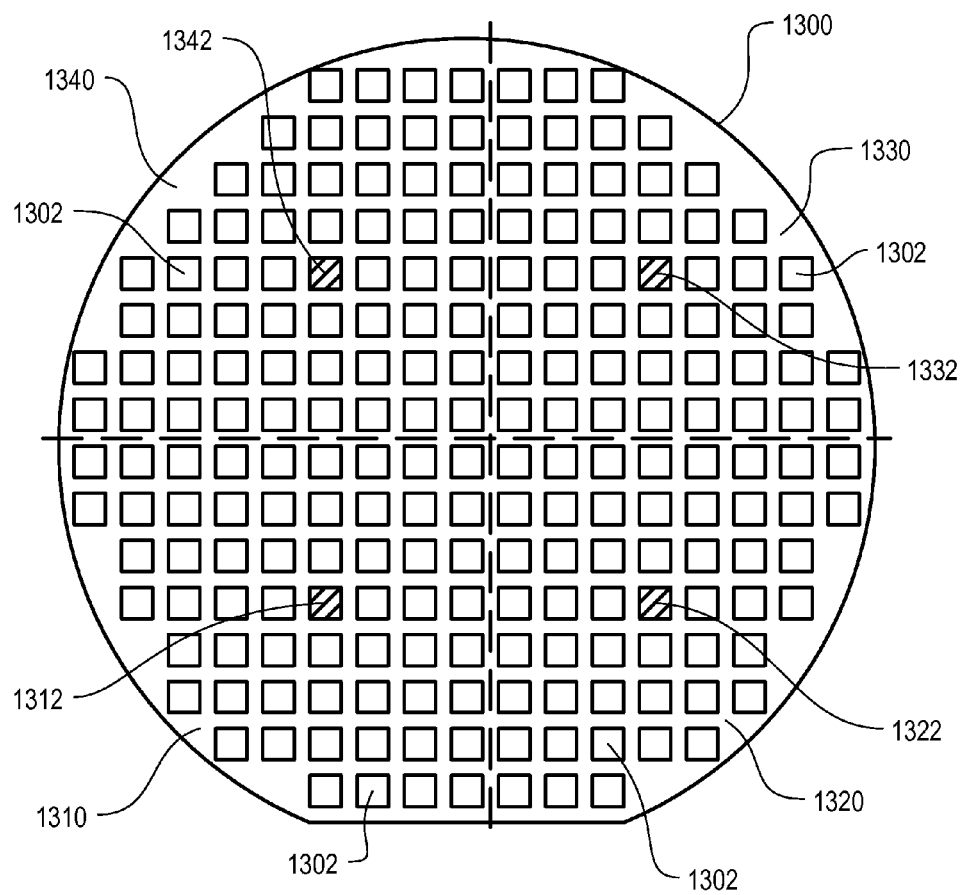
FIG. 13 is a semiconductor wafer including a plurality of semiconductor devices according to an embodiment.

Referring now to FIG. 13, a semiconductor wafer including a plurality of semiconductor devices according to an embodiment is set forth in a schematic diagram and given the general reference character 1300. FIG. 13 is a top plan view of semiconductor wafer 1300.

Semiconductor wafer 1300 can include semiconductor devices 1302 formed integrally on a top surface. Semiconductor devices 1302 can be formed in batch and under similar and generally during the same process steps. In this way, operating characteristics all known good die (semiconductor devices 1302 without defects) of each semiconductor device 1302 on semiconductor wafer may be substantially similar. A semiconductor wafer 1300 may be very large, 12 inches or more in diameter. Thus, there can be substantial distances between semiconductor devices 1302 on opposite edges of semiconductor wafer 1300. Such difference can produce some process variations. Semiconductor devices 1302 may have the same constituents as semiconductor device 100.

Figure 14:
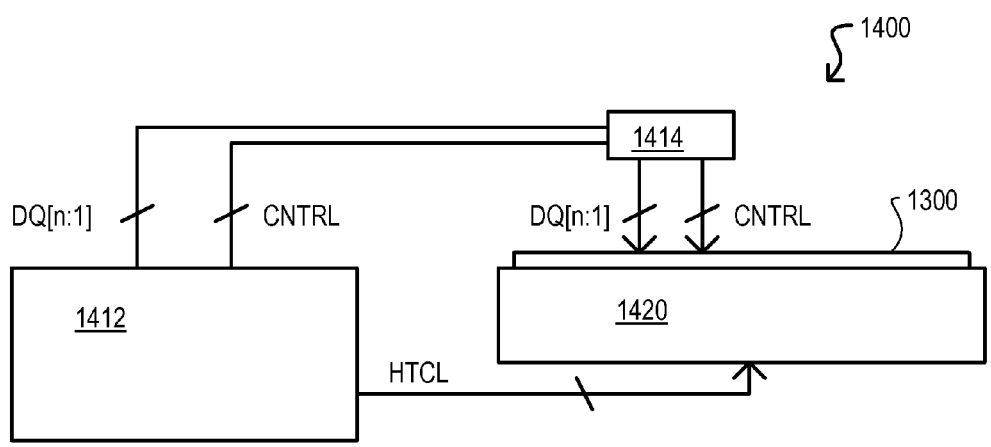
FIG. 14 is a block schematic diagram illustrating a test apparatus that can test a semiconductor device on a semiconductor wafer according to an embodiment.

Referring now to FIG. 14, a block schematic diagram illustrating a test apparatus that can test a semiconductor device on a semiconductor wafer according to an embodiment is set forth and given the general reference character 1400. The test apparatus 1400 can include a test control apparatus 1412, a probe card 1414, and a chuck 1420. Test apparatus 1400 may be used to perform the test methods (300, 900, and 1200) illustrated in FIGS. 3, 9, and 12, respectively.

Test control apparatus 1412 can provide temperature control signals HCTL on a bus received by chuck 1420. Test control apparatus 1412 may also provide control signals CNTRL to probe card 1414. Test control apparatus 1412 may also provide and/or receive data DQ[n:1] to probe card 1414.

Probe card 1414 may provide an electrical contact between test control apparatus 1412 and a semiconductor device under test formed on semiconductor wafer 1300.

Control signals CNTRL may include address signals, command signals, clock signals, and/or data signals or the like for operating a semiconductor device under test on semiconductor wafer 1300. Chuck 1420 may provide a predetermined temperature value to semiconductor device 1300 in response to temperature control signals HCTL. A semiconductor device under test formed integrally on semiconductor wafer 1300 may receive control signals CNTRL from test control apparatus 1412 (via probe card 1414) and may provide and/or receive data DQ[n:1] (via probe card 1414).

Referring now to FIG. 13 in conjunction with FIG. 14, semiconductor wafer 1300 may include regions (1310, 1320, 1330, and 1340). Each region (1310, 1320, 1330, and 1340) may respectively include a semiconductor device (1312, 1322, 1332, and 1342) to be tested by test apparatus 1400 with a test method (such as test methods (300, 900, and 1200)) so that regional performance parameters for temperature ranges (W1 to W2″) may be determined.

At a later step, regional performance parameters for temperature ranges (W1 to W2″) for each respective region (1310, 1320, 1330, and 1340) may then be programmed into performance parameter tables 170 for each semiconductor device 1302 within the respective region (1310, 1320, 1330, and 1340).

Figure 15:
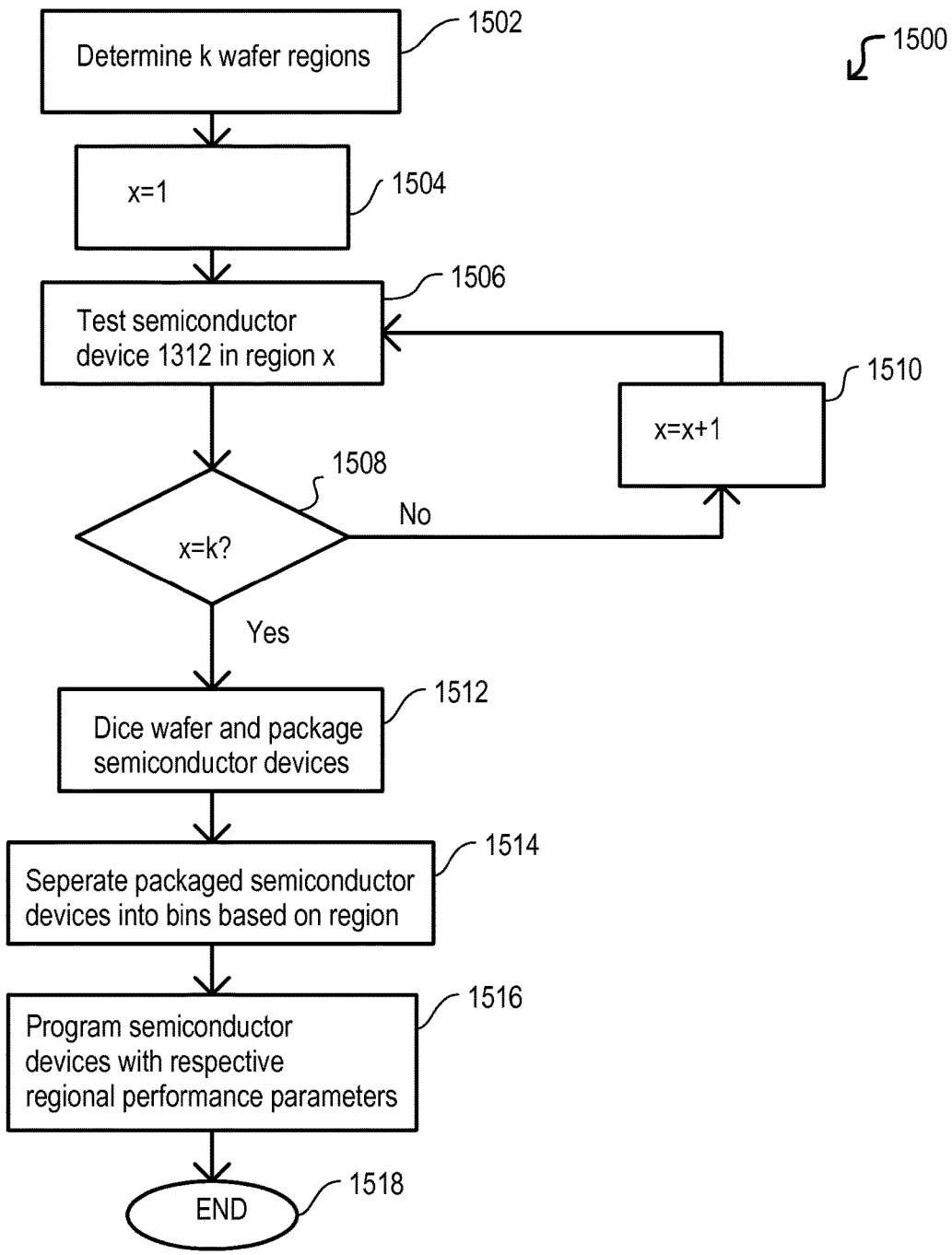
FIG. 15 is a flow diagram of a method of testing and programming semiconductor devices on a semiconductor wafer according to an embodiment.

Referring now to FIG. 15, a method of testing and programming semiconductor devices on a semiconductor wafer according to an embodiment is set forth in a flow diagram and given the general reference character 1500.

Method 1500 will now be explained with reference to FIG. 15 in conjunction with FIGS. 13 and 14.

In a step 1502, the number of regions (1310, 1320, 1330, and 1340) in semiconductor wafer 1300 may be determined, for example k regions.

In a step 1504, a variable x may be set to 1, thereby identifying the first region (for example, region 1310) is to be tested.

In a step 1506, semiconductor device 1312 for region x (i.e. the first region as x=1) is tested. In step 1506, methods (300, 900, and/or 1200) may be followed in the test and a test apparatus 1400 may be used to perform the above-mentioned test.

In a step 1508, it is determined if x=k. If x<k, the method 1500 proceeds to step 1510. In step 1510, x is incremented (x=x+1) and the method 1500 returns to step 1506. The method continues in this loop until a predetermined semiconductor device (1312, 1322, 1332, and 1342), respectively in each region (1310, 1320, 1330, and 1340) in semiconductor wafer 1300 has been tested to determine regionally based performance parameters for temperature ranges (W1 to W2″).

When a predetermined semiconductor device (1312, 1322, 1332, and 1342), respectively, in each region (1310, 1320, 1330, and 1340) in semiconductor wafer 1300 has been tested, x=k in step 1508, so the method 1500 proceeds to step 1512.

At step 1512, the semiconductor wafer 1300 may be diced (by saw, laser, or the like) and semiconductor devices 1302 may be packaged.

Next, at a step 1514, the packaged semiconductor devices may be separated into bins based on region (1310, 1320, 1330, and 1340) from the semiconductor wafer 1300 each device 1302 originated.

Next at a step 1516, each packaged semiconductor device is programmed with respective regional performance parameters (determined at step 1506) in accordance with the bin identification.

Next, at step 1518 the method 1500 may end.

Figure 16:
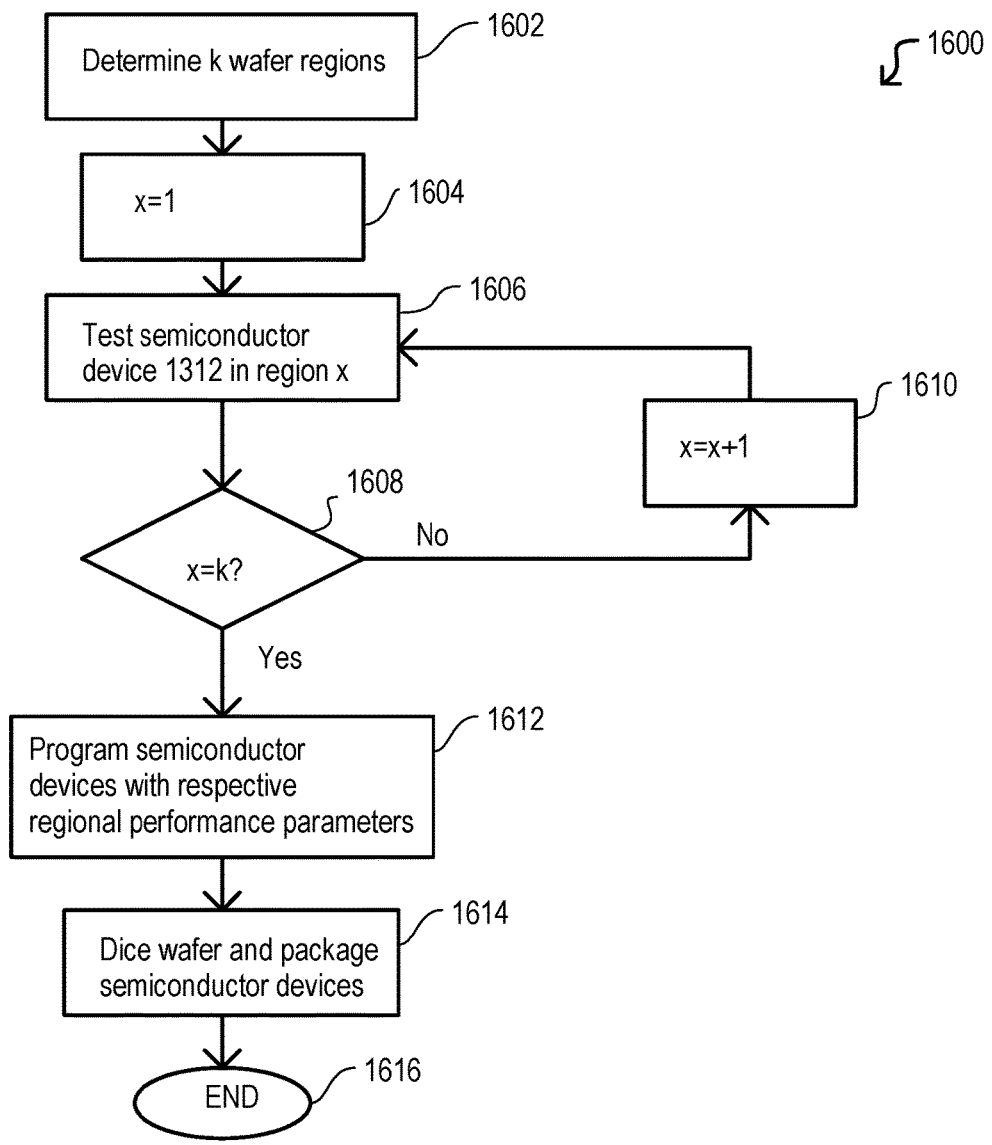
FIG. 16 is a flow diagram of a method of testing and programming semiconductor devices on a semiconductor wafer according to an embodiment.

In the method 1500, only predetermined semiconductor devices (1312, 1322, 1332, and 1342) may be tested over temperature ranges (W1 to W2″) to determine regional based performance parameters for each temperature range (W1 to W2″). All other semiconductor devices 1302 may then be programmed with the regional based performance parameters at a later step (for example, after packaging). In this way, time may be saved by eliminating the need to test each semiconductor device 1302. Furthermore, the need to use an invasive probe (from probe card 1414) on each semiconductor device 1302 may be eliminated. Furthermore, by determining performance parameters over temperature ranges (W1 to W2″) on a semiconductor wafer 1300, a chuck 1420 that can provide a wide range of temperatures in direct contact with a large number of semiconductor devices 1302 can reduce the need to repeatedly provide the temperatures for each individual semiconductor device 1302 separately. Referring now to FIG. 16, a method of testing and programming semiconductor devices on a semiconductor wafer according to an embodiment is set forth in a flow diagram and given the general reference character 1600.

Method 1600 may include steps (1602, 1604, 1606, 1608, and 1610) that may be substantially the same as steps (1502, 1504, 1506, 1508, and 1510), respectively, of method 1500 and therefore the detailed description may be omitted.

Method 1600 may differ from method 1600 in when a predetermined semiconductor device (1312, 1322, 1332, and 1342), respectively, in each region (1310, 1320, 1330, and 1340) in semiconductor wafer 1300 has been tested, x=k in step 1608, the method 1600 proceeds to step 1612 in which each semiconductor device 1302 is programmed with respective regional performance parameters (determined at step 1506) while still on semiconductor wafer 1300.

Method 1600 then proceeds to step 1614 in which semiconductor wafer 1300 may be diced (by saw, laser, or the like) and semiconductor devices 1302 may be packaged.

Method 1600 then ends at step 1616.

Figure 17:
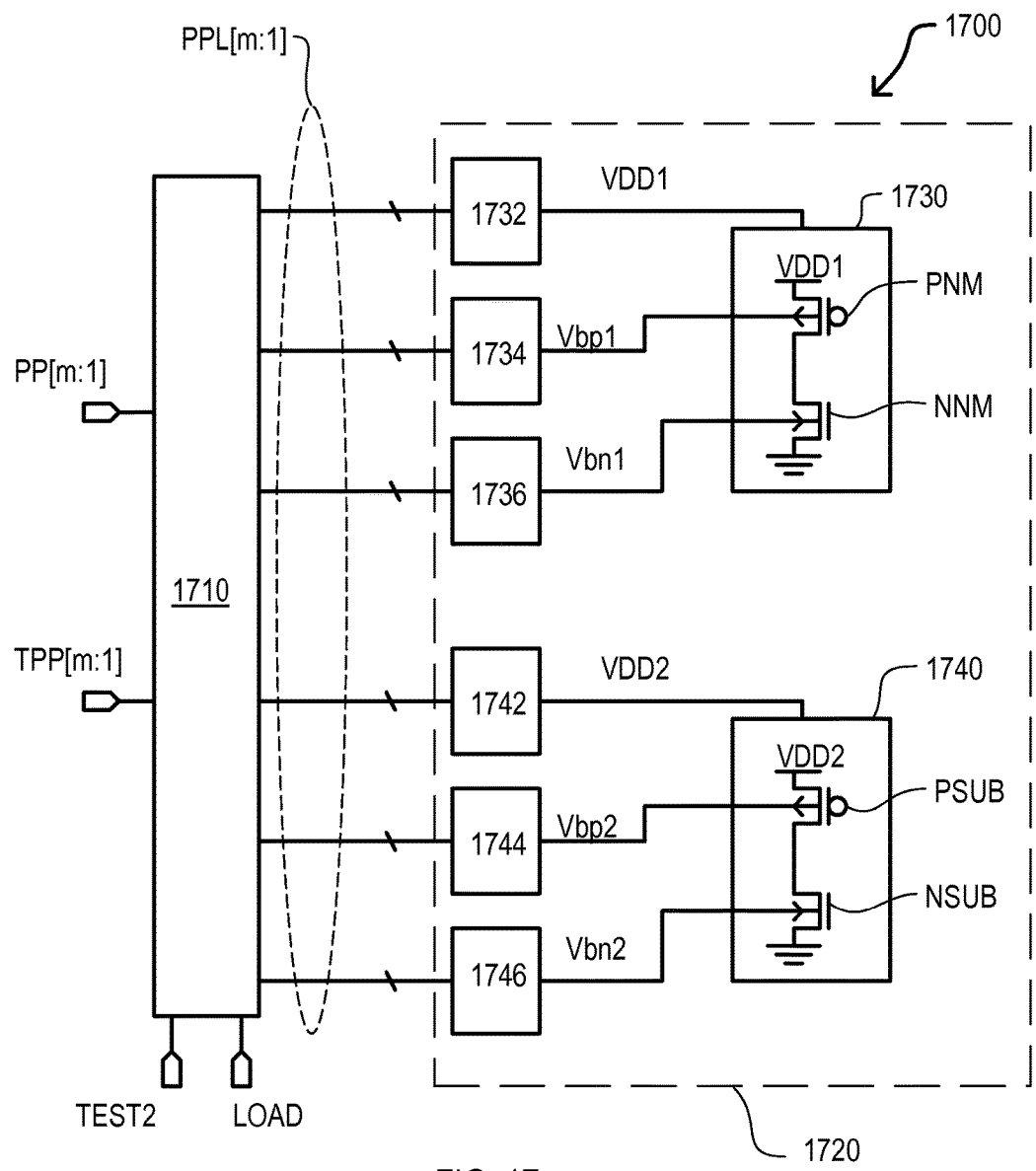
FIG. 17 is a block schematic diagram of an example of operational circuits according to an embodiment.

Referring now to FIG. 17, an example of operational circuits according to an embodiment are set forth in a block schematic diagram and given the general reference character 1700. Operational circuits 1700 can be operational circuits 195 in semiconductor device 100 of FIG. 1. Operational circuits 1700 can include registers 1710 and performance parameter adjusted (adjustable) circuits 1720. Performance parameter adjusted circuits 1720 may have operational aspects adjusted in accordance with latched performance parameters PPL[m:1] latched into registers 1710.

Registers 1710 may receive performance parameters PP[m:1], load signal LOAD, test performance parameters TPP[m:1], and test signal TEST2 as inputs and may provide latched performance parameters PPL[m:1] as outputs. Performance parameter adjusted circuits 1720 may receive latched performance parameters PPL[m:1].

When test signal TEST2 is at a logic high (i.e. enabled), registers 1710 may pass test performance parameters TPP[m:1] as latched performance parameters PPL[m:1]. When test signal is logic low (i.e. disabled), then registers 1710 may latch the performance parameters PP[m:1] to provide latched performance parameters PPL[m:1].

Performance parameter adjusted circuits 1720 may be used in a semiconductor device (such as semiconductor device 100) that have sub-threshold voltage operating circuits and above sub-threshold voltage operating circuits. A sub-threshold voltage operating circuit is a circuit that operates at a power supply potential level below the threshold voltages of the included transistors (i.e. IGFETs). An above sub-threshold voltage operating circuit is a circuit that operates at a power supply potential level above the threshold voltages of the included transistors (i.e. IGFETs).

Performance parameter adjusted circuits 1720 can include above sub-threshold voltage operating circuits 1730, sub-threshold voltage operating circuits 1740, power supply generating circuits (1732 and 1742), and back bias voltage generating circuits (1734, 1736, 1744, and 1746).

Above sub-threshold voltage operating circuits 1730 can include circuits that are configured of p-channel IGFETs PNM and n-channel IGFETs NNM. P-channel IGFETs PNM may receive a back body bias Vbp1 and n-channel IGFETs NNM may receive a back body bias Vbn1. The circuits in above sub-threshold voltage operating circuits 1730 may receive a power supply VDD1.

Sub-threshold voltage operating circuits 1740 can include circuits that are configured of p-channel IGFETs PSUB and n-channel IGFETs NSUB. P-channel IGFETs PSUB may receive a back body bias Vbp2 and n-channel IGFETs NSUB may receive a back body bias Vbn2. The circuits in above sub-threshold voltage operating circuits 1740 may receive a power supply VDD2.

Each of power supply generating circuits (1732 and 1742), and back bias voltage generating circuits (1734, 1736, 1744, and 1746) may receive a unique plurality (subset) of latched performance parameters (PPL[m:1]) as inputs and may adjust the potentials of their outputs in response thereto.

Power supply generating circuit 1732 may receive a plurality of latch performance parameters (PPL[m:1]) as inputs and may provide a power supply VDD1 as an output. Power supply VDD1 may be used as a power supply for above sub-threshold voltage operating circuits 1730. In this way, the potential of power supply VDD1 may vary in response to a temperature range in which the semiconductor device is operating.

Back bias voltage generating circuit 1734 may receive a plurality of latch performance parameters (PPL[m:1]) as inputs and may provide a back body bias Vbp1 as an output. Back body bias Vbp1 may be used as back body bias for p-channel IGFETs PNM in above sub-threshold voltage operating circuits 1730. In this way, the potential of back body bias Vbp1 may vary in response to a temperature range in which the semiconductor device is operating.

Back bias voltage generating circuit 1736 may receive a plurality of latch performance parameters (PPL[m:1]) as inputs and may provide a back body bias Vbn1 as an output. Back body bias Vbn1 may be used as back body bias for n-channel IGFETs NNM in above sub-threshold voltage operating circuits 1730. In this way, the potential of back body bias Vbn1 may vary in response to a temperature range in which the semiconductor device is operating. Power supply generating circuit 1742 may receive a plurality of latch performance parameters (PPL[m:1]) as inputs and may provide a power supply VDD2 as an output. Power supply VDD2 may be used as a power supply for sub-threshold voltage operating circuits 1740. In this way, the potential of power supply VDD2 may vary in response to a temperature range in which the semiconductor device is operating.

Back bias voltage generating circuit 1744 may receive a plurality of latch performance parameters (PPL[m:1]) as inputs and may provide a back body bias Vbp2 as an output. Back body bias Vbp2 may be used as back body bias for p-channel IGFETs PSUB in sub-threshold voltage operating circuits 1740. In this way, the potential of back body bias Vbp2 may vary in response to a temperature range in which the semiconductor device is operating.

Back bias voltage generating circuit 1746 may receive a plurality of latch performance parameters (PPL[m:1]) as inputs and may provide a back body bias Vbn2 as an output. Back body bias Vbn2 may be used as back body bias for n-channel IGFETs NSUB in sub-threshold voltage operating circuits 1740. In this way, the potential of back body bias Vbn2 may vary in response to a temperature range in which the semiconductor device is operating.

As described above, performance parameter adjusted circuits 1720 in a semiconductor device 100 may have tight control over back body biases (Vbp1, Vbn1, Vbp2, and Vbn2) and power supply voltages (VDD1 and VDD2) to control threshold voltages and power supply voltages of operational circuits for both above sub-threshold voltage operating circuits 1730 and sub-threshold operating circuits 1740 in a plurality of temperature ranges (such as temperature ranges (W1 to W2″ shown in FIG. 2) so that speed and/or power consumption may be improved without designing for margins at extreme corners.

During the test mode of operation, such as performed in test methods (900, 1200, and 1600), test signal TEST2 may be at a logic high when optimizing performance parameters.

Figure 18:
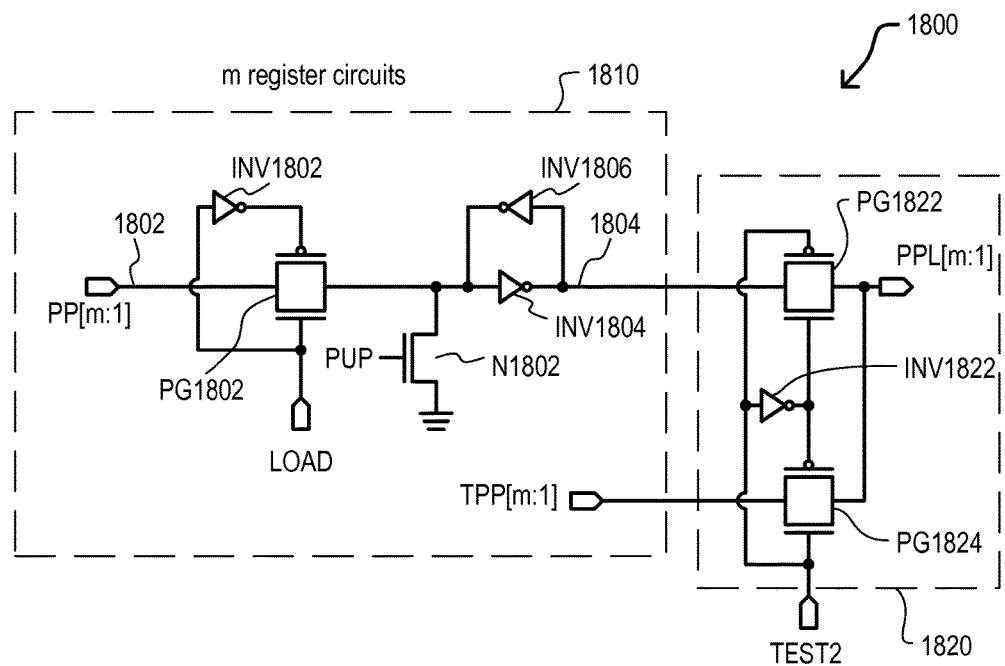
FIG. 18 is a circuit schematic diagram of a register circuit according to an embodiment.

Referring now to FIG. 18, a register circuit 1800 according to an embodiment is set forth in a circuit schematic diagram.

There may be "m" register circuits 1800 comprising registers 1710 in operational circuit 195.

Each register circuit 1800 may receive a predetermined one of performance parameters PP[m:1], load signal LOAD, a predetermined one of test performance parameters TPP[m:1], test signal TEST2, and power up signal PUP at input terminals and may provide a corresponding latched performance parameter PPL[m:1] at an output terminal.

Each register circuit 1800 may include a register portion 1810 and a multiplexer circuit 1820.

Register portion 1810 may receive a predetermined one of performance parameters PP[m:1], load signal LOAD, and power up signal PUP at input terminals and may provide a corresponding latched output at a terminal 1804. Multiplexer circuit 1810 may receive the latched output from register portion 1810, a predetermined one of test performance parameters TPP[m:1], and test signal TEST2 as inputs and may provide a corresponding latched performance parameter PPL[m:1] at an output terminal.

Each register portion 1810 may include inverters (INV1802, INV1804, and INV1806), a pass gate PG1802, and an N-channel IGFET N1802.

Pass gate PG1802 may receive one of performance parameters PP[m:1] at an input terminal 1802 and a load signal LOAD at a control input and may provide an output to an input of inverter INV1804. Inverter INV1802 may receive load signal LOAD and may provide an output to another control input terminal of pass gate PG1802. N-channel IGFET N1802 may have a source connected to ground, a drain connected to the input of inverter INV1804, and a gate connected to receive a power up signal PUP. Inverter INV1804 may provide a latched output to terminal 1804. Inverter INV1806 may have an input connected to terminal 1804 and an output connected to the input of inverter INV1804 to form a latch.

Multiplexer circuit 1820 may include pass gates (PG1822 and PG1824) and inverter INV1822.

Inverter INV1822 may receive test signal TEST2 as an input at an input terminal and may provide an output at an output terminal.

Pass gate PG1822 may receive the latched output at terminal 1804 from latch portion 1810 at an input terminal, test signal TEST2 at a p-channel control input, and the output of inverter INV1822 at a n-channel control input, and may provide a corresponding latched performance parameter PPL[m:1] at an output terminal.

Pass gate PG1824 may receive a predetermined one of test performance parameters TPP[m:1] at an input terminal, test signal TEST2 at a n-channel control input, and the output of inverter INV1822 at a p-channel control input, and may provide a corresponding latched performance parameter PPL[m:1] at an output terminal.

When test signal TEST2 is at a logic high (i.e. enabled), pass gate PG1824 may be turned on and a low impedance path may be provided between a predetermined one of test performance parameters TPP[m:1] and the output terminal to pass the predetermined one of test performance parameters TPP[m:1] as latched performance parameter PPL[m:1]. When test signal TEST2 is at a logic high, pass gate PH1822 is turned off to provide a high impedance path between terminal 1804 and the output terminal.

When test signal TEST2 is at a logic low (i.e. disabled), pass gate PG1822 may be turned on and a low impedance path may be provided between the latched output at terminal 1804 and the output terminal to pass the latched output at terminal 1804 as latched performance parameter PPL[m:1]. When test signal TEST2 is at a logic low, pass gate PH1824 is turned off to provide a high impedance path between the predetermined one of test performance parameters TPP[m:1] and the output terminal.

In this way, when test signal TEST2 is at a logic high (i.e. enabled), register circuit 1800 may pass test performance parameters TPP[m:1] as latched performance parameters PPL[m:1]. When test signal is logic low (i.e. disabled), then register circuit 1800 may latch the performance parameters PP[m:1] (in response to load signal LOAD) to provide latched performance parameters PPL[m:1].

Figure 19:
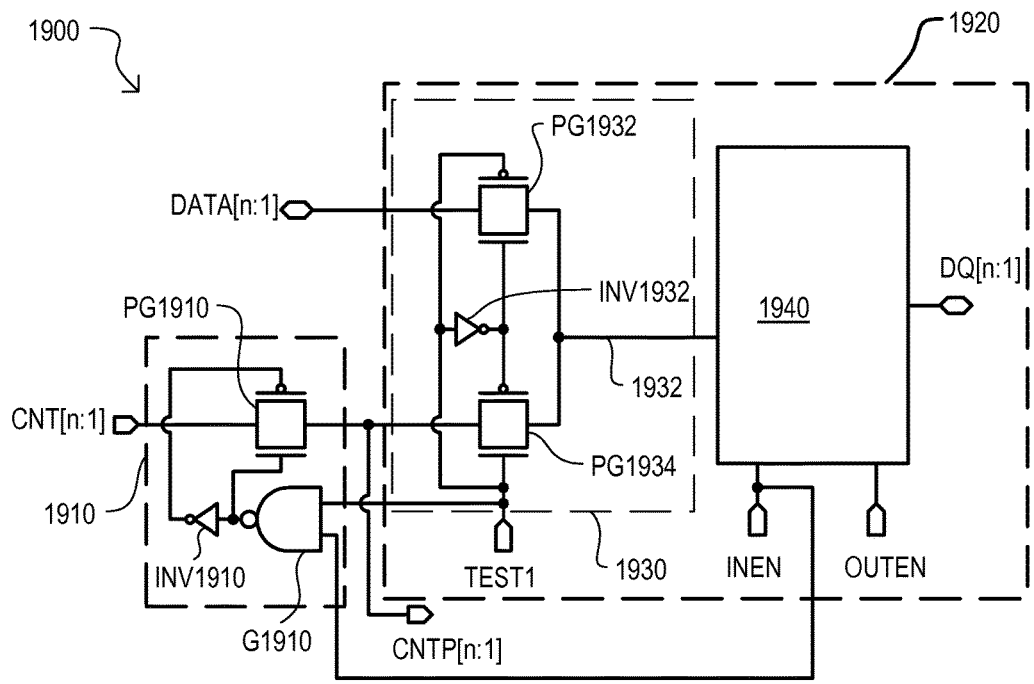
FIG. 19 is circuit schematic diagram of an input/output buffer circuit and pass gate circuit according to an embodiment.

Referring now to FIG. 19, an input/output buffer circuit and pass gate circuit according to an embodiment are set forth in a circuit schematic diagram and given the general reference character 1900. Input/output buffer circuit and pass gate circuit 1900 can represent one of n input/output buffer circuit 196 and pass gate circuits 145 in semiconductor device of FIG. 1.

Input/output buffer circuit and pass gate circuit 1900 can include a pass gate circuit 1910 and an input/output buffer circuit 1920.

Pass gate circuit 1910 can receive count value CNT[n:1] at an input terminal and may have an output terminal connected to provide count value CNTP[n:1]. Input/output buffer circuit 1920 may receive test signal TEST1, input enable signal INEN, and output enable signal OUTEN at input terminals. Input/output buffer circuit 1920 may receive and/or provide count value CNT[n:1], data DATA[n:1], and data signals DQ[n:1] at respective terminals (bidirectional terminals).

Pass gate circuit 1910 can include logic gate circuit G1910, inverter circuit INV1910, and a pass gate PG1910. Logic gate circuit G1910 can be a NAND logic gate. Logic gate circuit G1910 can receive test signal TEST1 and input enable signal INEN at respective input terminals and may provide an output. Inverter INV1910 may receive the output of logic gate circuit G1910 at an input terminal and may provide an output. Pass gate PG1910 may be a pass gate including complementary IGFETS (a p-channel IGFET and an n-channel IGFET) having source/drain terminals connected in parallel between terminals providing count values (CNT[n:1] and CNT[p:1]). The n-channel IGFET may receive the output of logic gate G1910 at a gate terminal and the p-channel IGFET may receive the output of inverter INV1910 at a gate terminal. In this way, pass gate PG1910 may provide a low impedance path between count values (CNT[n:1] and CNT[p:1]) when either test signal TEST1 or input enable signal INEN are at a logic low (disabled) and a high impedance path between count values (CNT[n:1] and CNT[p:1]) when test signal TEST1 and input enable signal INEN are both at a logic high (enabled).

Input/output buffer circuit 1920 can include a multiplexer circuit 1930 and a buffer circuit 1940. Multiplexer circuit 1930 can receive test signal TEST1 as an input and may electrically connect either data DATA[n:1] or count value CNT[n:1] to a terminal 1932 in response to test signal TEST1 Buffer circuit 1920 may provide a bidirectional path between data signal DQ[n:1] and terminal 1932 in accordance with the logic levels of input enable signal INEN and output enable signal OUTEN. When input enable signal INEN is at a logic high, buffer circuit 1940 may pass data signal DQ[n:1] to terminal 1932. When output enable signal OUTEN is at a logic high, buffer circuit 1940 may pass a signal at terminal 1932 to data signal DQ[n:1].

Multiplexer circuit 1930 can include pass gates (PG1932 and PG1934) and an inverter INV1932.

Inverter INV1932 may receive test signal TEST1 at an input terminal and may provide an output at an output terminal. Pass gates (PG1932 and PG1934) may each include complementary IGFETS (a p-channel IGFET and an n-channel IGFET) having source/drain terminals connected in parallel. Pass gate PG1932 may receive test signal TEST1 at a p-channel IGFET control (gate) terminal and may receive the output of inverter INV1932 at an re-channel IGFET control (gate) terminal. In this way, pass gate PG1932 may provide a low impedance path between data DATA[n:1] and terminal 1932 when test signal TEST1 is at a logic low level (disabled) and a may provide a high impedance path between data DATA[n:1] and terminal 1932 when test signal TEST1 is at a logic high level (enabled). Pass gate PG1934 may receive test signal TEST1 at an n-channel IGFET control (gate) terminal and may receive the output of inverter INV1932 at a p-channel IGFET control (gate) terminal. In this way, pass gate PG1934 may provide a high impedance path between count value CNTP[n:1] and terminal 1932 when test signal TEST1 is at a logic low level (disabled) and a may provide a low impedance path between count value CNTP[n:1] and terminal 1932 when test signal TEST1 is at a logic high level (enabled).

Figure 20:
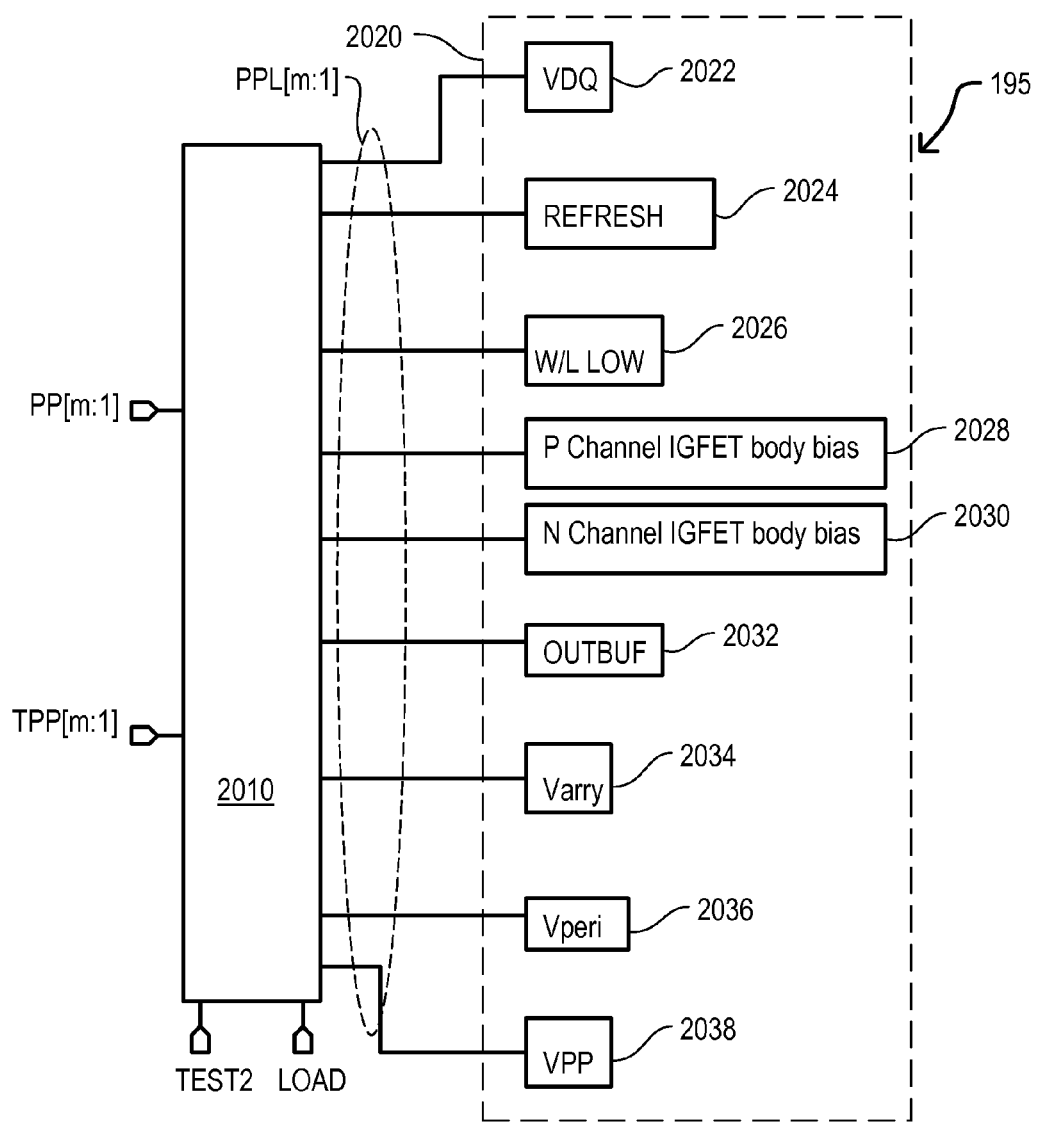
FIG. 20 is a block schematic diagram of an example of operational circuits according to an embodiment.

Referring now to FIG. 20, another example of operational circuits 195 are set forth in a block schematic diagram. Operational circuits can include registers 2010 and performance parameter adjusted (adjustable) circuits 2020. Performance parameter adjusted circuits 2020 may have operational aspects adjusted in accordance with latched performance parameters PPL[m:1] latched into registers 2020.

Registers 2010 may receive performance parameters PP[m:1], load signal LOAD, test performance parameters TPP[m:1], and test signal TEST2 as inputs and may provide latched performance parameters PPL[m:1] as outputs. Performance parameter adjusted circuits 2020 may receive latched performance parameters PPL[m:1].

When test signal TEST2 is at a logic high (i.e. enabled), registers 2010 may pass test performance parameters TPP[m:1] as latched performance parameters PPL[m:1]. When test signal is logic low (i.e. disabled), then registers 2010 may latch the performance parameters PP[m:1] to provide latched performance parameters PPL[m:1].

Performance parameter adjusted circuits 2020 may include a plurality of circuits. For example, performance parameter adjusted circuits 2020 can include an output buffer voltage generating circuit 2022, a DRAM refresh circuit 2024, a word line low potential generating circuit 2026, P-channel IGFET body bias potential generating circuit 2028, N-channel IGFET body bias potential generating circuit 2030, output buffer circuit 2032, an array potential generating circuit 2034, a peripheral potential generating circuit 2036 and a VPP generating circuit 2038.

It is understood that a unique plurality (subset) of latched performance parameters PPL[m:1] may be respectively provided to each performance parameter adjusted circuits 2020 including output buffer voltage generating circuit 2022, a DRAM refresh circuit 2024, a word line low potential generating circuit 2026, P-channel IGFET body bias potential generating circuit 2028, N-channel IGFET body bias potential generating circuit 2030, output buffer circuit 2032, array potential generating circuit 2034, peripheral potential generating circuit 2036 and VPP generating circuit 2038.

Performance parameter adjusted circuits 2020 may be used in a semiconductor device 100 when semiconductor device is a DRAM, for example.

Figure 21:
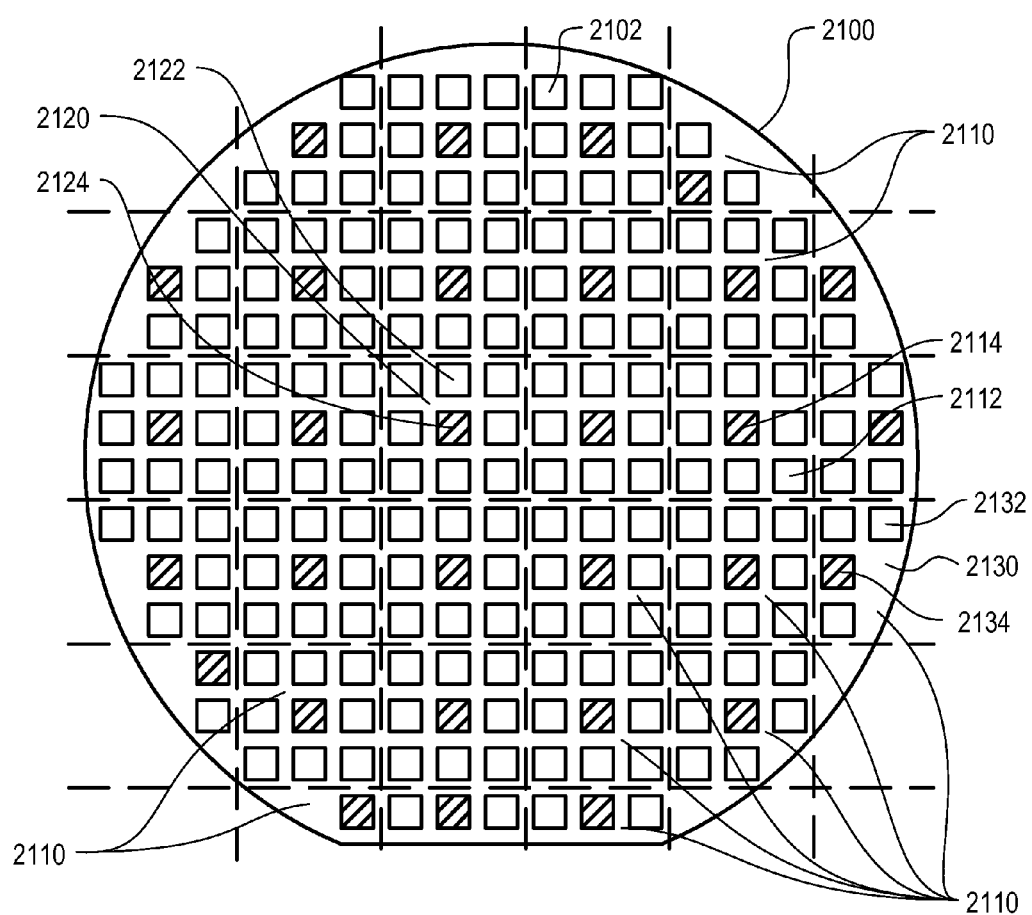
FIG. 21 is a semiconductor wafer including a plurality of semiconductor devices according to an embodiment.

Referring now to FIG. 21, a semiconductor wafer including a plurality of semiconductor devices according to an embodiment is set forth in a schematic diagram and given the general reference character 2100. FIG. 21 is a top plan view of semiconductor wafer 2100. Semiconductor wafer 2100 may include a plurality of semiconductor devices 2102 contiguously formed on semiconductor wafer 2100. Semiconductor wafer 2100 may be essentially identical to semiconductor wafer 1300 of FIG. 13 except semiconductor wafer 2100 may be divided into substantially more regions 2110. Semiconductor wafer 2100 shows thirty regions 2110 (although not all are labeled with reference character 2110 to avoid unduly cluttering the figure). Each region may include a semiconductor device 2114 (shown with diagonal hatching) that is to be tested by a test apparatus 1400 using a test method (such as test methods (300, 900, and 1200) so that regional performance parameters for temperature ranges (W1 to W2″) may be determined. At a later step, regional performance parameters for temperature ranges (W1 to W2″) for each respective region 2110 may then be programmed into performance parameter tables 170 for each semiconductor device 2102 within the respective region 2110.

Semiconductor wafer 2100 may include central regions 2120 which have a tested semiconductor device 2124 and adjacent semiconductor devices 2122 which may not be tested but may be programmed with regional performance parameters based on the tested semiconductor device. Semiconductor wafer 2100 may include edge regions 2130 that may include a tested semiconductor device 2134 and adjacent semiconductor devices 2132 which may not be tested but may be programmed with regional performance parameters based on the tested semiconductor device. The tested semiconductor device 2134 may be selected to ensure there are no intervening semiconductor devices between tested semiconductor device and adjacent semiconductor devices 2132.

In this way, semiconductor device 2100 may include semiconductor devices 2102 that are proximate to and adjacent the tested semiconductor device 2114 in which regional performance parameters are obtained. By doing so a tighter current or speed performance window may be obtained in the optimization procedure.

A temperature circuit may include, for example, temperature sensor circuits (120 and 140) of FIG. 1.

A temperature circuit can provide a plurality of temperature ranges, each temperature range having a temperature range upper limit value and a temperature range lower limit value, with adjacent ones of the plurality of temperature ranges overlap. The temperature ranges may be utilized to provide performance parameters to performance parameter adjustable circuits to provide improved operating performance of the device over a wide range of temperatures.

Semiconductor device 100 can be a dynamic random access memory (DRAM), static random access memory (SRAM), non-volatile memory (such as a FLASH memory device using floating gate memory cells or phase change RAM using programmable resistive devices), processor, or general semiconductor device, as just a few examples.

Each unique count value (CNT[n:1] or CNTP[n:1]) may select a set of performance parameters PP[m:1] that can be the performance parameters for the temperature range (W1 to W2″) corresponding to the unique count value (CNT[n:1] or CNTP[n:1]).

Other electrical apparatus other than semiconductor devices may benefit from the invention.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A device, comprising:
a temperature circuit that sets a plurality of temperature ranges;
a performance parameter table, the performance parameter table provides performance parameters based on the temperature range in which the device is operating; and
performance parameter adjustable circuits coupled to receive the performance parameters and test performance parameters.

2. The device of claim 1, further including:
a first counter circuit coupled to provide the test performance parameters.

3. The device of claim 2, wherein:
the first counter circuit is coupled to receive an increment signal, the first counter circuit incrementally changes the test performance parameters in response to the increment signal.

4. The device of claim 3, wherein:
the first counter circuit is coupled to receive a reset signal, the first counter circuit resets the test performance parameters to a predetermined state in response to the reset signal.

5. The device of claim 1, further including:
a plurality of multiplexer circuits, each multiplexer circuit is coupled to receive one of the performance parameters at a first multiplexer input terminal and one of the test performance parameters at a second multiplexer input terminal and provide an output at a multiplexer output terminal, the performance parameter adjustable circuits include input terminals, each input terminal of the performance parameter adjustable circuits is coupled to one of the multiplexer output terminals from the plurality of multiplexer circuits.

6. The device of claim 5, wherein:
the plurality of multiplexer circuits are coupled to receive a test signal at a control terminal, each multiplexer circuit provides a low impedance path between the one of the test performance parameters and the multiplexer output terminal when the test signal has a first logic level and a high impedance path between the one of the test performance parameters and the multiplexer output terminal when the test signal has a second logic level.

7. The device of claim 6, wherein:
each one of the plurality of multiplexer circuits includes
    a first pass gate having a controllable impedance path coupled between the first multiplexer input terminal and the multiplexer output terminal; and
    a second pass gate having a controllable impedance path coupled between the second multiplexer input terminal and the multiplexer output terminal.

8. The device of claim 7, further including:
a plurality of latch circuits, each latch circuit having a latch input terminal coupled to receive one of the performance parameters and a latch output terminal coupled to one of the second multiplexer input terminals of the plurality of multiplexers.

9. The device of claim 8, wherein:
each one of the plurality of latch circuits is coupled to receive a load signal, each one of the latch circuits latches a corresponding performance parameter in response to the load signal.

10. The device of claim 1, wherein:
the performance parameter adjustable circuits include subthreshold voltage operating circuits including at least one first insulated gate field effect transistor (IGFET) having a first conductivity type and a first IGFET threshold voltage, the subthreshold voltage operating circuits operate from a power supply having a potential less than the first IGFET threshold voltage.

11. The device of claim 10, wherein:
the at least one first IGFET is coupled to receive a first back body bias potential having a potential determined by the performance parameters in a normal mode of operation and the test performance parameters in a test mode of operation.

12. The device of claim 1, wherein:
the performance parameter adjustable circuits further include above subthreshold voltage operating circuits including at least one second IGFET having a first conductivity type and a second IGFET threshold voltage, the above subthreshold voltage operating circuits operate from a second power supply having a potential greater than the second IGFET threshold voltage.

13. The device of claim 12, wherein:
the at least one second IGFET is coupled to receive a second back body bias potential having a potential determined by the performance parameters in a normal mode of operation and the test performance parameters in a test mode of operation.

14. The device of claim 1, wherein:
the device is a semiconductor device.

15. The device of claim 14, wherein:
the semiconductor device is a semiconductor memory device.

16. A device, comprising:
a temperature circuit that sets a plurality of temperature ranges;
a performance parameter table, the performance parameter table provides performance parameters based on the temperature range in which the device is operating; and
performance parameter adjustable circuits coupled to receive the performance parameters from the performance parameter table; and
the performance parameter table is programmed with the performance parameters received externally from the device.

17. The device of claim 16, further including:
a serial register coupled to serially receive externally provided performance parameters in response to a clock signal and provide in parallel the performance parameters to be programmed into the performance parameter table.

18. The device of claim 17, wherein:
the performance parameters are programmed into the performance parameter table in response to a program signal.

19. The device of claim 16, further including:
a buffer circuit coupled to receive data externally to the device at a data terminal and provide the data to the performance parameter table, wherein the performance parameter table addresses a location in response to the value of the data.

20. The device of claim 16, wherein:
the device is a semiconductor device.

* * * * *